United States Patent
Haller et al.

(10) Patent No.: US 7,687,342 B2
(45) Date of Patent: Mar. 30, 2010

(54) METHOD OF MANUFACTURING A MEMORY DEVICE

(75) Inventors: Gordon A. Haller, Boise, ID (US); David K. Hwang, Boise, ID (US); Sanh Dang Tang, Boise, ID (US); Ceredig Roberts, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 1003 days.

(21) Appl. No.: 11/219,349

(22) Filed: Sep. 1, 2005

(65) Prior Publication Data

US 2007/0045712 A1   Mar. 1, 2007

(51) Int. Cl.
  *H01L 21/8242*   (2006.01)
(52) U.S. Cl. ............... 438/239; 257/296; 257/E21.646
(58) Field of Classification Search ................. 438/239; 257/296, E21.646
  See application file for complete search history.

(56) References Cited

U.S. PATENT DOCUMENTS

| | | | |
|---|---|---|---|
| 3,731,287 A | 5/1973 | Seely et al. |
| 3,732,287 A | 5/1973 | Himmele et al. |
| 4,234,362 A | 11/1980 | Riseman |
| 4,419,809 A | 12/1983 | Riseman et al. |
| 4,432,132 A | 2/1984 | Kinsbron et al. |
| 4,502,914 A | 3/1985 | Trumpp et al. |
| 4,508,579 A | 4/1985 | Goth et al. |
| 4,570,325 A | 2/1986 | Higuchi |
| 4,648,937 A | 3/1987 | Ogura et al. |
| 4,716,131 A | 12/1987 | Okazawa et al. |
| 4,776,922 A | 10/1988 | Bhattacharyya et al. |
| 4,838,991 A | 6/1989 | Cote et al. |
| 4,903,344 A | 2/1990 | Inoue |
| 4,983,544 A | 1/1991 | Lu et al. |
| 5,013,680 A | 5/1991 | Lowrey et al. |
| 5,024,959 A | 6/1991 | Pfiester |
| 5,047,117 A | 9/1991 | Roberts |
| 5,053,105 A | 10/1991 | Fox, III |
| 5,117,027 A | 5/1992 | Bernhardt et al. |

(Continued)

FOREIGN PATENT DOCUMENTS

DE      280 851 A1      7/1990

(Continued)

OTHER PUBLICATIONS

Cho et al., "A novel pillar DRAM cell for 4Gbit and beyond," *Digest of Technical Papers Symposium on VLSI Technology*, Jun. 1998, pp. 38-39.

(Continued)

*Primary Examiner*—Steven J Fulk
(74) *Attorney, Agent, or Firm*—Wells St. John P.S.

(57) ABSTRACT

A memory device comprises an active area comprising a source and at least two drains defining a first axis. At least two substantially parallel word lines are defined by a first pitch, with one word line located between each drain and the source. Digit lines are defined by a second pitch, one of the digit lines being coupled to the source and forming a second axis. The active areas of the memory array are tilted at 45° to the grid defined by the word lines and digit lines. The word line pitch is about 1.5F, while the digit line pitch is about 3F.

14 Claims, 15 Drawing Sheets

U.S. PATENT DOCUMENTS

| | | |
|---|---|---|
| 5,295,092 A | 3/1994 | Hotta |
| 5,305,252 A | 4/1994 | Saeki |
| 5,328,810 A * | 7/1994 | Lowrey et al. .............. 430/313 |
| 5,330,879 A | 7/1994 | Dennison |
| 5,514,885 A | 5/1996 | Myrick |
| 5,539,229 A | 7/1996 | Noble et al. |
| 5,569,620 A | 10/1996 | Linn et al. |
| 5,596,759 A | 1/1997 | Miller et al. |
| 5,604,159 A | 2/1997 | Cooper et al. |
| 5,638,318 A | 6/1997 | Seyyedy |
| 5,670,794 A | 9/1997 | Manning |
| 5,677,865 A | 10/1997 | Seyyedy |
| 5,680,344 A | 10/1997 | Seyyedy |
| 5,700,733 A | 12/1997 | Manning |
| 5,748,519 A | 5/1998 | Tehrani et al. |
| 5,753,546 A | 5/1998 | Koh et al. |
| 5,756,395 A | 5/1998 | Rostoker et al. |
| 5,780,349 A | 7/1998 | Naem |
| 5,789,269 A | 8/1998 | Mehta et al. |
| 5,789,320 A | 8/1998 | Andricacos et al. |
| 5,795,830 A | 8/1998 | Cronin et al. |
| 5,804,458 A | 9/1998 | Tehrani et al. |
| 5,841,611 A | 11/1998 | Sakakima et al. |
| 5,861,328 A | 1/1999 | Tehrani et al. |
| 5,892,708 A | 4/1999 | Pohm |
| 5,895,238 A | 4/1999 | Mitani |
| 5,902,690 A | 5/1999 | Tracy et al. |
| 5,913,116 A | 6/1999 | Gardner et al. |
| 5,917,749 A | 6/1999 | Chen et al. |
| 5,956,267 A | 9/1999 | Hurst et al. |
| 5,963,803 A | 10/1999 | Dawson et al. |
| 5,994,743 A | 11/1999 | Masuoka |
| 5,998,256 A | 12/1999 | Juengling |
| 6,004,862 A | 12/1999 | Kim et al. |
| 6,005,798 A | 12/1999 | Sakakima et al. |
| 6,005,800 A | 12/1999 | Koch et al. |
| 6,010,946 A | 1/2000 | Hisamune et al. |
| 6,042,998 A | 3/2000 | Brueck et al. |
| 6,057,573 A | 5/2000 | Kirsch et al. |
| 6,063,688 A | 5/2000 | Doyle et al. |
| 6,066,191 A | 5/2000 | Tanaka et al. |
| 6,071,789 A | 6/2000 | Yang et al. |
| 6,097,065 A | 8/2000 | Forbes et al. |
| 6,104,068 A | 8/2000 | Forbes |
| 6,104,633 A | 8/2000 | Abraham et al. |
| 6,111,782 A | 8/2000 | Sakakima et al. |
| 6,134,139 A | 10/2000 | Bhattacharyya et al. |
| 6,141,204 A | 10/2000 | Schuegraf et al. |
| 6,147,405 A | 11/2000 | Hu |
| 6,150,211 A | 11/2000 | Zahurak |
| 6,150,687 A | 11/2000 | Noble et al. |
| 6,157,064 A | 12/2000 | Huang |
| 6,165,833 A | 12/2000 | Parekh et al. |
| 6,175,146 B1 | 1/2001 | Lane et al. |
| 6,211,044 B1 | 4/2001 | Xiang et al. |
| 6,236,590 B1 | 5/2001 | Bhattacharyya et al. |
| 6,271,080 B1 | 8/2001 | Mandelman et al. |
| 6,274,905 B1 | 8/2001 | Mo |
| 6,282,113 B1 | 8/2001 | Debrosse |
| 6,288,454 B1 | 9/2001 | Allman et al. |
| 6,291,334 B1 | 9/2001 | Somekh |
| 6,297,554 B1 | 10/2001 | Lin |
| 6,320,222 B1 | 11/2001 | Forbes et al. |
| 6,348,380 B1 | 2/2002 | Weimer et al. |
| 6,350,635 B1 | 2/2002 | Noble et al. |
| 6,355,961 B1 | 3/2002 | Forbes |
| 6,362,057 B1 | 3/2002 | Taylor et al. |
| 6,368,950 B1 | 4/2002 | Xiang et al. |
| 6,376,317 B1 | 4/2002 | Forbes et al. |
| 6,377,070 B1 | 4/2002 | Forbes |
| 6,383,907 B1 | 5/2002 | Hasegawa et al. |
| 6,395,613 B1 | 5/2002 | Juengling |
| 6,396,096 B1 * | 5/2002 | Park et al. .................. 257/296 |
| 6,399,979 B1 | 6/2002 | Noble et al. |
| 6,404,056 B1 | 6/2002 | Kuge et al. |
| 6,413,825 B1 | 7/2002 | Forbes |
| 6,414,356 B1 | 7/2002 | Forbes et al. |
| 6,423,474 B1 | 7/2002 | Holscher |
| 6,424,001 B1 | 7/2002 | Forbes et al. |
| 6,424,561 B1 | 7/2002 | Li et al. |
| 6,448,601 B1 | 9/2002 | Forbes et al. |
| 6,455,372 B1 | 9/2002 | Weimer |
| 6,461,957 B1 | 10/2002 | Yokoyama et al. |
| 6,475,867 B1 | 11/2002 | Hui et al. |
| 6,496,034 B2 | 12/2002 | Forbes et al. |
| 6,504,201 B1 | 1/2003 | Noble et al. |
| 6,514,884 B2 | 2/2003 | Maeda |
| 6,522,584 B1 | 2/2003 | Chen et al. |
| 6,531,727 B2 | 3/2003 | Ahn et al. |
| 6,534,243 B1 | 3/2003 | Templeton |
| 6,545,904 B2 | 4/2003 | Tran |
| 6,548,396 B2 | 4/2003 | Naik et al. |
| 6,559,017 B1 | 5/2003 | Brown et al. |
| 6,559,491 B2 | 5/2003 | Forbes et al. |
| 6,566,280 B1 | 5/2003 | Meagley et al. |
| 6,566,682 B2 | 5/2003 | Forbes |
| 6,573,030 B1 | 6/2003 | Fairbairn et al. |
| 6,602,779 B1 | 8/2003 | Li et al. |
| 6,632,741 B1 | 10/2003 | Clevenger et al. |
| 6,638,441 B2 * | 10/2003 | Chang et al. .................. 216/46 |
| 6,639,268 B2 | 10/2003 | Forbes et al. |
| 6,646,303 B2 | 11/2003 | Satoh et al. |
| 6,664,806 B2 | 12/2003 | Forbes et al. |
| 6,667,237 B1 | 12/2003 | Metzler |
| 6,673,684 B1 | 1/2004 | Huang et al. |
| 6,677,230 B2 | 1/2004 | Yokoyama et al. |
| 6,686,245 B1 | 2/2004 | Mathew et al. |
| 6,686,274 B1 | 2/2004 | Shimazu et al. |
| 6,689,695 B1 | 2/2004 | Lui et al. |
| 6,699,763 B2 | 3/2004 | Grider et al. |
| 6,706,571 B1 | 3/2004 | Yu et al. |
| 6,709,807 B2 | 3/2004 | Hallock et al. |
| 6,734,107 B2 | 5/2004 | Lai et al. |
| 6,744,094 B2 | 6/2004 | Forbes |
| 6,768,663 B2 | 7/2004 | Ogata |
| 6,773,998 B1 | 8/2004 | Fisher et al. |
| 6,777,725 B2 | 8/2004 | Willer et al. |
| 6,794,699 B2 | 9/2004 | Bissey et al. |
| 6,794,710 B2 | 9/2004 | Chang et al. |
| 6,800,930 B2 | 10/2004 | Jackson et al. |
| 6,801,056 B2 | 10/2004 | Forbes |
| 6,825,529 B2 | 11/2004 | Chidambarrao et al. |
| 6,867,116 B1 | 3/2005 | Chung |
| 6,875,703 B1 | 4/2005 | Furukawa et al. |
| 6,893,972 B2 | 5/2005 | Rottstegge et al. |
| 6,908,800 B1 | 6/2005 | Kim et al. |
| 6,946,709 B2 | 9/2005 | Yang |
| 6,955,961 B1 | 10/2005 | Chung |
| 6,962,867 B2 | 11/2005 | Jackson et al. |
| 7,015,124 B1 | 3/2006 | Fisher et al. |
| 7,042,047 B2 | 5/2006 | Eppich |
| 7,049,702 B2 | 5/2006 | Tseng |
| 7,074,668 B1 | 7/2006 | Park et al. |
| 7,084,076 B2 | 8/2006 | Park et al. |
| 7,098,536 B2 | 8/2006 | Yang et al. |
| 7,105,089 B2 | 9/2006 | Fanselow et al. |
| 7,112,483 B2 | 9/2006 | Lin et al. |
| 7,118,960 B2 | 10/2006 | Tran |
| 7,151,690 B2 | 12/2006 | Forbes |
| 7,183,597 B2 | 2/2007 | Doyle |
| 7,208,379 B2 | 4/2007 | Venugopal et al. |
| 7,214,629 B1 | 5/2007 | Luo et al. |
| 7,238,580 B2 | 7/2007 | Orlowski et al. |
| 7,291,560 B2 | 11/2007 | Parascandola et al. |

| | | | | | | |
|---|---|---|---|---|---|---|
| 7,432,553 | B2 | 10/2008 | Chen et al. | 2006/0267075 A1 | 11/2006 | Sandhu et al. |
| 2001/0005631 | A1 | 6/2001 | Kim et al. | 2006/0273456 A1 | 12/2006 | Sant et al. |
| 2001/0019870 | A1 | 9/2001 | Noble | 2006/0278911 A1* | 12/2006 | Eppich ................. 257/296 |
| 2002/0000608 | A1 | 1/2002 | Harada | 2006/0281250 A1* | 12/2006 | Schloesser ............ 438/253 |
| 2002/0042198 | A1 | 4/2002 | Bjarnason et al. | 2006/0281266 A1 | 12/2006 | Wells |
| 2002/0045308 | A1 | 4/2002 | Juengling | 2006/0286740 A1 | 12/2006 | Lin et al. |
| 2002/0063110 | A1 | 5/2002 | Cantell et al. | 2007/0026672 A1 | 2/2007 | Tang et al. |
| 2002/0123216 | A1 | 9/2002 | Yokoyama et al. | 2007/0045712 A1 | 3/2007 | Haller et al. |
| 2002/0127810 | A1 | 9/2002 | Nakamura et al. | 2007/0048674 A1 | 3/2007 | Wells |
| 2002/0130348 | A1 | 9/2002 | Tran | 2007/0049011 A1 | 3/2007 | Tran |
| 2002/0158273 | A1 | 10/2002 | Satoh et al. | 2007/0049030 A1 | 3/2007 | Sandhu et al. |
| 2002/0182847 | A1 | 12/2002 | Yokoyama et al. | 2007/0049032 A1 | 3/2007 | Abatchev et al. |
| 2003/0006410 | A1 | 1/2003 | Doyle | 2007/0049035 A1 | 3/2007 | Tran |
| 2003/0044722 | A1 | 3/2003 | Hsu et al. | 2007/0049040 A1 | 3/2007 | Bai et al. |
| 2003/0119307 | A1 | 6/2003 | Bekiaris et al. | 2007/0050748 A1 | 3/2007 | Juengling |
| 2003/0127426 | A1 | 7/2003 | Chang et al. | 2007/0145450 A1 | 6/2007 | Wang et al. |
| 2003/0132480 | A1 | 7/2003 | Chau et al. | 2007/0210449 A1 | 9/2007 | Caspary et al. |
| 2003/0157436 | A1 | 8/2003 | Manger et al. | 2007/0215960 A1 | 9/2007 | Zhu et al. |
| 2003/0207207 | A1 | 11/2003 | Li | 2007/0275309 A1 | 11/2007 | Liu |
| 2003/0207584 | A1 | 11/2003 | Sivakumar et al. | | | |
| 2003/0227072 | A1 | 12/2003 | Forbes et al. | | FOREIGN PATENT DOCUMENTS | |
| 2003/0230234 | A1 | 12/2003 | Nam et al. | | | |
| 2004/0000534 | A1 | 1/2004 | Lipinski | DE | 280851 | 7/1990 |
| 2004/0002203 | A1 | 1/2004 | Deshpande et al. | DE | 42 36 609 A1 | 5/1994 |
| 2004/0018738 | A1 | 1/2004 | Liu | EP | 0 227 303 A2 | 7/1987 |
| 2004/0023475 | A1 | 2/2004 | Bonser et al. | EP | 0227303 | 7/1987 |
| 2004/0023502 | A1 | 2/2004 | Tzou et al. | EP | 0 491 408 A2 | 11/1991 |
| 2004/0041189 | A1 | 3/2004 | Voshell et al. | EP | 0491408 | 6/1992 |
| 2004/0043623 | A1 | 3/2004 | Liu et al. | EP | 1 061 592 | 6/2000 |
| 2004/0053475 | A1 | 3/2004 | Sharma | EP | 1 357 433 A2 | 10/2003 |
| 2004/0079456 | A1 | 4/2004 | Mandigo et al. | EP | 1357433 | 10/2003 |
| 2004/0079988 | A1 | 4/2004 | Harari | EP | 0 681 338 | 10/2004 |
| 2004/0105330 | A1 | 6/2004 | Juengling | EP | 0 936 623 | 4/2005 |
| 2004/0106257 | A1 | 6/2004 | Okamura et al. | JP | 5-343370 | 12/1993 |
| 2004/0150111 | A1 | 8/2004 | Shimazu et al. | JP | 05343370 | 12/1993 |
| 2004/0195613 | A1 | 10/2004 | Kweon | JP | H8-55908 | 2/1996 |
| 2004/0235255 | A1 | 11/2004 | Tanaka | JP | H8-55920 | 2/1996 |
| 2005/0045965 | A1 | 3/2005 | Lin et al. | WO | WO 02/099864 | 12/2002 |
| 2005/0046048 | A1 | 3/2005 | Yun et al. | WO | WO 02/099864 A1 | 12/2002 |
| 2005/0059242 | A1 | 3/2005 | Cabral et al. | WO | WO 2004/003977 | 1/2004 |
| 2005/0074949 | A1 | 4/2005 | Jung et al. | WO | WO 2004/001799 A2 | 12/2004 |
| 2005/0148136 | A1 | 7/2005 | Brask et al. | WO | WO 2005/010973 | 2/2005 |
| 2005/0156208 | A1 | 7/2005 | Lin et al. | WO | WO 2005/010973 A1 | 2/2005 |
| 2005/0164443 | A1 | 7/2005 | Kim et al. | WO | WO 2005/034215 A1 | 4/2005 |
| 2005/0164454 | A1 | 7/2005 | Leslie | WO | PCT/US2005/029984 | 8/2005 |
| 2005/0184348 | A1 | 8/2005 | Youn et al. | WO | WO 2006/026699 | 3/2006 |
| 2005/0186705 | A1 | 8/2005 | Jackson et al. | | | |
| 2005/0272259 | A1 | 12/2005 | Hong | | | |
| 2006/0003182 | A1 | 1/2006 | Lane et al. | | OTHER PUBLICATIONS | |
| 2006/0011996 | A1 | 1/2006 | Wu et al. | | | |
| 2006/0019488 | A1 | 1/2006 | Liaw | | | |
| 2006/0024945 | A1 | 2/2006 | Kim et al. | | | |
| 2006/0028859 | A1 | 2/2006 | Forbes | | | |
| 2006/0033678 | A1 | 2/2006 | Lubomirsky et al. | | | |
| 2006/0046200 | A1 | 3/2006 | Abatchev et al. | | | |
| 2006/0046201 | A1 | 3/2006 | Sandhu et al. | | | |
| 2006/0046407 | A1 | 3/2006 | Juengling | | | |
| 2006/0046422 | A1 | 3/2006 | Tran et al. | | | |
| 2006/0046484 | A1 | 3/2006 | Abatchev et al. | | | |
| 2006/0073613 | A1 | 4/2006 | Aggarwal et al. | | | |
| 2006/0076090 | A1 | 4/2006 | Mandigo et al. | | | |
| 2006/0083996 | A1 | 4/2006 | Kim | | | |
| 2006/0094180 | A1 | 5/2006 | Doczy et al. | | | |
| 2006/0099793 | A1 | 5/2006 | Yang et al. | | | |
| 2006/0157795 | A1 | 7/2006 | Chen et al. | | | |
| 2006/0172540 | A1 | 8/2006 | Marks et al. | | | |
| 2006/0211260 | A1 | 9/2006 | Tran et al. | | | |
| 2006/0216923 | A1 | 9/2006 | Tran et al. | | | |
| 2006/0231900 | A1 | 10/2006 | Lee et al. | | | |
| 2006/0246217 | A1 | 11/2006 | Weidman et al. | | | |
| 2006/0252264 | A1 | 11/2006 | Kimizuka et al. | | | |
| 2006/0263699 | A1 | 11/2006 | Abatchev et al. | | | |
| 2006/0264043 | A1 | 11/2006 | Stewart et al. | | | |

Denton et al., "Fully depleted dual-gated thin-film SOI P-MOSFET's fabricated in SOI islands with an isolated buried polysilicon backgate," *IEEE Electron Device Letters*, vol. 17, No. 11, Nov. 1996, pp. 509-511.

Doyle et al., "High performance fully-depleted tri-gate CMOS transistors," *IEEE Electron Device Letters*, vol. 23, No. 4, Apr. 2003, pp. 263-265.

Doyle et al., "Tri-gate fully-depleted CMOS transistors: fabrication, design and layout," *2003 Symposium on VLSI Technology Digest of Technical Papers*, Jun. 2003, Kyoto, Japan, pp. 133-134.

Endoh et al., "2.4F$^2$ memory cell technology with stacked-surrounding gate transistor (S-SGT) DRAM," *IEEE Transactions on Electron Devices*, vol. 48, No. 8, Aug. 2001, pp. 1599-1603.

Endoh et al., "Novel ultrahigh-density flash memory with a stacked-surrounding gate transistor (S-SGT) structured cell," *IEEE Transactions on Electron Devices*, vol. 50, No. 4, Apr. 2003, pp. 945-951.

Goebel et al., "Fully depleted surrounding gate transistor (SGT) for 70 nm DRAM and beyond," *International Electron Devices Meeting*, Dec. 2002, pp. 275-278.

Huang et al., "Sub-50 nm p-channel FinFET," *IEEE Transactions on Electron Devices*, vol. 58, No. 5, May 2001, pp. 880-886.

Kalavade et al., "A novel sub-10nm transistor," *IEEE Device Research Conference*, Jun. 2000, Denver, Colorado, pp. 71-72.

Kedzierski et al., "High-performance symmetric-gate and CMOS-compatible V$_t$ asymmetric-gate FinFET devices," *IEDM*, 2001, paper 19.5.

Miyano et al., "Numerical analysis of a cylindrical thin-pillar transistor (CYNTHIA)," *IEEE Transactions on Electron Device*, vol. 39, No. 8, Aug. 1992, pp. 1876-1891.

Nitayama et al., "Multi-pillar surrounding gate transistor (M-SGT) for compact and high-speed circuits," *IEEE Transactions on Electron Devices*, vol. 38, No. 3, Mar. 1991, pp. 573-578.

Pohm et al., "Experimental and analytical properties of 0.2-μm-wide, end-on, multilayer, giant magnetoresistance, read head sensors," *Journal of Applied Physics*, vol. 79, Issue 8, Apr. 1996, pp. 5889-5891.

Sunouchi et al., "A Surrounding Gate Transistor (SGT) Cell for 64/256Mbit DRAMS", *IEEE*, ULSI Research Center, Toshiba Corporation, Japan, 1989, pp. 2.1.1-2.1.4.

Takato et al., "High performance CMOS surrounding gate transistor (SGT) for ultra high density LSIs," *IEEE Electron Devices Meeting Technical Digest*, 1988, pp. 222-225.

Terauchi et al., "A surrounding gate transistor (SGT) gain cell for ultra high density DRAMS," *1993 Symposium on VLSI Technology Digest of Technical Papers*, 1993, Tokyo, Japan, pp. 21-22.

Wong et al., "Self-aligned (top and bottom) double-gate MOSFET with a 25 nm thick silicon channel," *IEEE International Electron Device Meeting*, 1997, pp. 427-430.

Xuan et al., "60nm planarized ultra-thin body solid phase epitaxy MOSFETs," *IEEE Device Research Conference*, Jun. 2000, Denver, Colorado, pp. 67-68.

U.S. Appl. No. 11/152,988, filed Jun. 14, 2005.

U.S. Appl. No. 10/934,778, filed Sep. 2, 2004.

B. Lim, Nature vol. 2, Nov. 2003 pp. 749-753.

International Search Report (PCT/US2006/033420), date of mailing Dec. 4, 2007.

Barth Roger: "Itrs commodity memory roadmap" Memory Technology, Design and Testing, 2003. Records of the 2003 International Workshop on Jul. 28-29, 2003, Piscataway, NJ, USA, IEEE, Jul. 28, 2003, pp. 61-63.

John L. Sturtevant, editor, "Developer-soluble Gap fill materials for patterning metal trenches in Via-first Dual Damascene process," preprint of Proceedings of SPIE: Advances in Resist Technology and Processing XXI, vol. 5376, 2004, 8 pages.

"Nanometer scale linewidth control during etching of polysilicon gates in high-density plasmas," Microelectronic Engineering 69 (2003), pp. 350-357.

"Nanoscale Multi-Line Patterning Using Sidewall Structure," Jpn., J. App.. Phys. vol. 41 (2002) Pt. 1, No. 6B, pp. 4410-4414.

"Pattern multiplication method and the uniformity of nanoscale multiple lines," J.Vac.Sci.Technol. B21(4), Jul./Aug. 2003, pp. 1491-1495.

"Pattern transfer into low dielectric materials by high-density plasma etching," Solid State Tech., May 2000, 8 pages.

"Resolution Enhancement Techniques for the 90nm Technology Node and Beyond," Future Fab International, Issue 15, Jul. 11, 2003, 4 pages.

Office Action received in U.S. Appl. No. 11/152,988, dated Mar. 21, 2008.

"U.S. Appl. No. 11/543,515, filed Oct. 24, 2006, Micron Ref. No. 2005-1173.00/US".

"Ex parte Cantell, unpublished decision of the Board of Patent Appeals and Interferences, Mar. 4, 2005".

Choi et al., "Sublithographic nanofabrication technology for nanocatalysts and DNA chips," *J.Vac. Sci. Technol.*, Nov./Dec. 2003; pp. 2951-2955.

Bergeron et al., "Resolution Enhancement Techniques for the 90nm Technology Node and Beyond", Future Fab International, Issue 15, Jul. 11, 2003, 4 pages.

Bhave et al., "Developer-soluble Gap fill materials for patterning metal trenches in Via-first Dual Damascene process", preprint of Proceedings of SPIE: Advances in Resist Technology and Processing XXI, vol. 5376, 2004, John L. Sturtevant, Editor, 8 pages.

Chung et al., "Nanoscale Multi-Line Patterning Using Sidewall Structure", Jpn., J. App. Phys. vol. 41 (2002) Pt. 1, No. 6B, pp. 4410-4414.

Chung et al., "Pattern multiplication method and the uniformity of nanoscale multiple lines", J. Vac. Sci. Technology, B21(4), Jul./Aug. 2003, pp. 1491-1495.

Joubert et al., "Nanometer scale linewidth control during etching of polysilicon gates in high-density plasmas", Microelectronic Engineering 69 (2003), pp. 350-357.

Lim et al., "Atomic Layer Deposition of Transition Metals", Nature vol. 2, Nov. 2003, pp. 749-753.

Mar. 21, 2008 Office Action received in U.S. Appl. No. 11/152,988, now U.S. Application Publication No. 2006/0281239.

Oehrlein et al., "Pattern transfer into low dielectric materials by high-density plasma etching", Solid State Tech., May 2000, 8 pages.

Pohm et al., "Experimental and analytical properties of 0.2 micron wide, multi-layer, GMR, memory elements," Transactions on Magnetics, Sep. 1996, pp. 4645-4647, vol. 32, No. 5.

* cited by examiner

METHOD OF MANUFACTURING A MEMORY DEVICE

CROSS-REFERENCE TO RELATED APPLICATIONS

This application is related to U.S. application Ser. No. 11/219,304, filed on Sep. 1, 2005, now U.S. Pat. No. 7,416,943, entitled "Peripheral Gate Stacks and Recessed Array Gates", naming Thomas Arthur Figura and Gordon A. Haller as inventors, and U.S. application Ser. No. 11/219,303, filed on Sep. 1 2005, entitled "Silicided Recessed Silicon", naming Hasan Nejad, Thomas Arthur Figura, Gordon A. Haller, Ravi Iyer, John Mark Meldrim and Justin Harnish as inventors.

FIELD OF THE INVENTION

This invention relates generally to integrated circuit design and, more particularly, to a layout for minimizing area while maximizing feature size.

BACKGROUND OF THE INVENTION

As a consequence of many factors, including demands for increased portability, computing power, memory capacity, and energy efficiency in modern electronics, integrated circuits are continuously being reduced in size. To facilitate these size reductions, the sizes of the constituent features, such as electrical devices and interconnect line widths, that form the integrated circuits, are also constantly being decreased.

The trend of decreasing feature size is most evident in memory circuits or devices, such as dynamic random access memories (DRAMs), static random access memories (SRAMs), ferroelectric (FE) memories, etc. To take one example, DRAM typically comprises millions of identical circuit elements, known as memory cells. In one application, a pair of memory cells comprises three electrical devices: two storage capacitors and an access field transistor having a single source shared by the memory cells, two gates, two channels, and two drains. The pair of memory cells, therefore, has two addressable locations that can each store one bit (binary digit) of data. A bit can be written to one of the cells' locations through the transistor and read by sensing charge on the drain electrode from the source electrode site.

By decreasing the sizes of constituent electrical devices and the conducting lines that access them, the sizes of the memory devices incorporating these features can be decreased. Storage capacities for a given chip area can thus be increased by fitting more memory cells onto memory devices.

The continual reduction in feature size places ever greater demands on the techniques used to form the features. One well-known technique is photolithography, commonly used to pattern features, such as conductive lines, on a substrate. The concept of pitch can be used to describe the size of these features. For the repeating patterns typical of memory arrays, pitch is defined as the distance between an identical point in two neighboring features. Adjacent features are typically separated by a material, such as an insulator. As a result, pitch can be viewed as the sum of the width of the feature and of the width of the space or material separating that feature from a neighboring feature. Due to optical factors, such as lens limitations and light or radiation wavelength, photolithographic techniques have minimum pitches below which a particular photolithographic technique cannot reliably form features. This minimum pitch is commonly referred to by a variable defining one half of the minimum pitch, or feature size F. This variable is often referred to as a "resolution." The minimum pitch, 2F, places a theoretical limit on feature size reduction.

Pitch doubling is one method for extending the capabilities of photolithographic techniques beyond their minimum pitch, achieving a pitch of less than 2F. Two pitch doubling techniques are illustrated and described in U.S. Pat. No. 5,328,810, issue to Lowrey et al., and in U.S. patent application Ser. No. 10/934,778, filed Sep. 2, 2004 (now U.S. Pat. No. 7,115,525) by Abatchev et al., the disclosures of which are incorporated herein by reference in their entirety. Such techniques can successfully reduce the potential photolithographic pitch; however, they also increase the cost of manufacturing.

Another method for improving the density possible using conventional photolithographic techniques is to change the layout of a memory device in order to fit more memory cells in the same area without changing the pitch. Using such a method, the size of the memory device can be reduced without exceeding the minimum pitch, 2F, dictated by optical limitations. Alternatively, the memory device may be configured to hold more memory cells, while maintaining a constant pitch.

These two methods, pitch doubling and memory layout changes, have rarely been used harmoniously. Accordingly, there is a need for a method of forming memory devices that have greater pitch between certain elements, even while the size of the memory devices shrinks or the density of the memory devices increases. Such a memory design or layout is especially desirable in conjunction with pitch multiplication, when the small pitch of the pitch-multiplied elements can potentially strain the capabilities of photolithographic techniques to adequately define and separate other elements of the memory devices.

SUMMARY OF THE INVENTION

According to one aspect of the invention, a memory device is disclosed. The memory device comprises a substantially linear active area comprising a source and at least two drains defining a first axis. The memory further comprises at least two substantially parallel word lines defined by a first pitch, at least a portion of a first word line located between a first of the at least two drains and the source, and at least a portion of a second word line located between a second of the at least two drains and the source. The memory device further comprises at least two digit lines defined by a second pitch, one of the at least two digit lines being coupled to the source and forming a second axis. An acute angle between the first and second axes is within the range of 10 to 80 degrees, and one of the first and second pitches is greater than two and a half times a minimum resolution (F) of a photolithographic technique used to form the memory device, and the other of the first and second pitches of the memory device is less than two times the minimum resolution.

According to another aspect of the present invention, an integrated circuit is provided. The integrated circuit comprises at least two memory cells comprising at least two drains sharing a source, the at least two memory cells defining a first longitudinal axis extending between at least one of the at least two drains and the source. The integrated circuit further comprises at least two substantially parallel, recessed word lines intersecting the at least two memory cells. The integrated circuit further comprises at least two digit lines defined by a pitch between 2.75 and 3.25 times a minimum resolution (F) of a photolithographic technique used to form the integrated circuit, one of the at least two digit lines being coupled to the source and extending along a second axis. Preferably, the first and second axes form an acute angle between them, and the word lines are defined by an effective pitch between 1.25 and 1.9 times the minimum resolution.

According to another aspect of the present invention, a system is provided. The system preferably comprises an active area comprising a source and a drain, and a word line formed by a pitch-doubling technique, at least a portion of which intersects the active area. The system further comprises at least two digit lines having a pitch of greater than two and a half times a minimum resolution (F) of a photolithographic technique used to form the system, one of the at least two digit lines being electrically coupled to the source.

According to another embodiment of the present invention, a method of manufacturing a memory device is disclosed. According to this method, a substrate is provided, and at least one active area is defined within the substrate, said active area comprising a source and two drains, the source and at least one of the drains forming a line along which a first axis is defined. At least one pair of word lines is also defined within the substrate by a pitch-doubling technique. At least two digit lines are defined above the substrate as well, at least a portion of one of the at least two digit lines extending above the source and defining a second axis that forms an acute angle with the first axis, and the at least two digit lines having a pitch of between 2.75 and 3.25 times a minimum resolution (F) of a photolithographic technique used to form the memory device.

According to another aspect of the present invention, a memory device is provided. The memory device comprises a substantially linear active area comprising a source and at least two drains defining a first axis. The memory device further comprises at least two substantially parallel word lines forming a second axis, at least a portion of a first word line located between a first of the at least two drains and the source, and at least a portion of a second word line located between a second of the at least two drains and the source. The memory device further comprises a digit line coupled to the source and forming a third axis, wherein the second and third axes are generally perpendicular, and wherein an acute angle between the first and third axes is within the range of 40 to 50 degrees.

According to another aspect of the present invention, a method of forming a memory device is disclosed. A substrate is provided, and at least one active area is defined within the substrate, said active area comprising a source and two drains, the source and at least one of the drains forming a line along which a first axis is defined. At least one pair of word lines is also defined within the substrate, the pair of word lines intersecting the at least one active area and the pair of word lines having a pitch of less than two times a minimum resolution (F) of a photolithographic technique used to form the memory device. At least two digit lines are also defined above the substrate along a second axis generally perpendicular to the at least one pair of word lines, at least a portion of one of the at least two digit lines extending above the source, and the at least two digit lines having a pitch of between 2.75 and 3.25 times the minimum resolution.

BRIEF DESCRIPTION OF THE DRAWINGS

The invention will be better understood from the detailed description of the preferred embodiments and from the appended drawings, which are meant to illustrate and not to limit the invention.

DETAILED DESCRIPTION OF THE PREFERRED EMBODIMENT

While the preferred embodiments of the present invention are illustrated in combination with a pitch doubling technique, it should be understood that the circuit design of these preferred embodiments may be incorporated into any integrated circuit. In particular, they may be advantageously applied to form any device having an array of electrical devices, including logic or gate arrays and volatile or non-volatile memory devices, such as DRAMs, RAMs, or flash memory. The integrated circuits formed by the methods described herein can be incorporated in any of a number of larger systems, such as motherboards, desktop or laptop computers, digital cameras, personal digital assistants, or any of a number of devices for which memory is useful.

The design and functioning of one memory device, a DRAM, laid out according to one embodiment of the present invention, is illustrated in the figures, and described in greater detail below.

Figure 1:
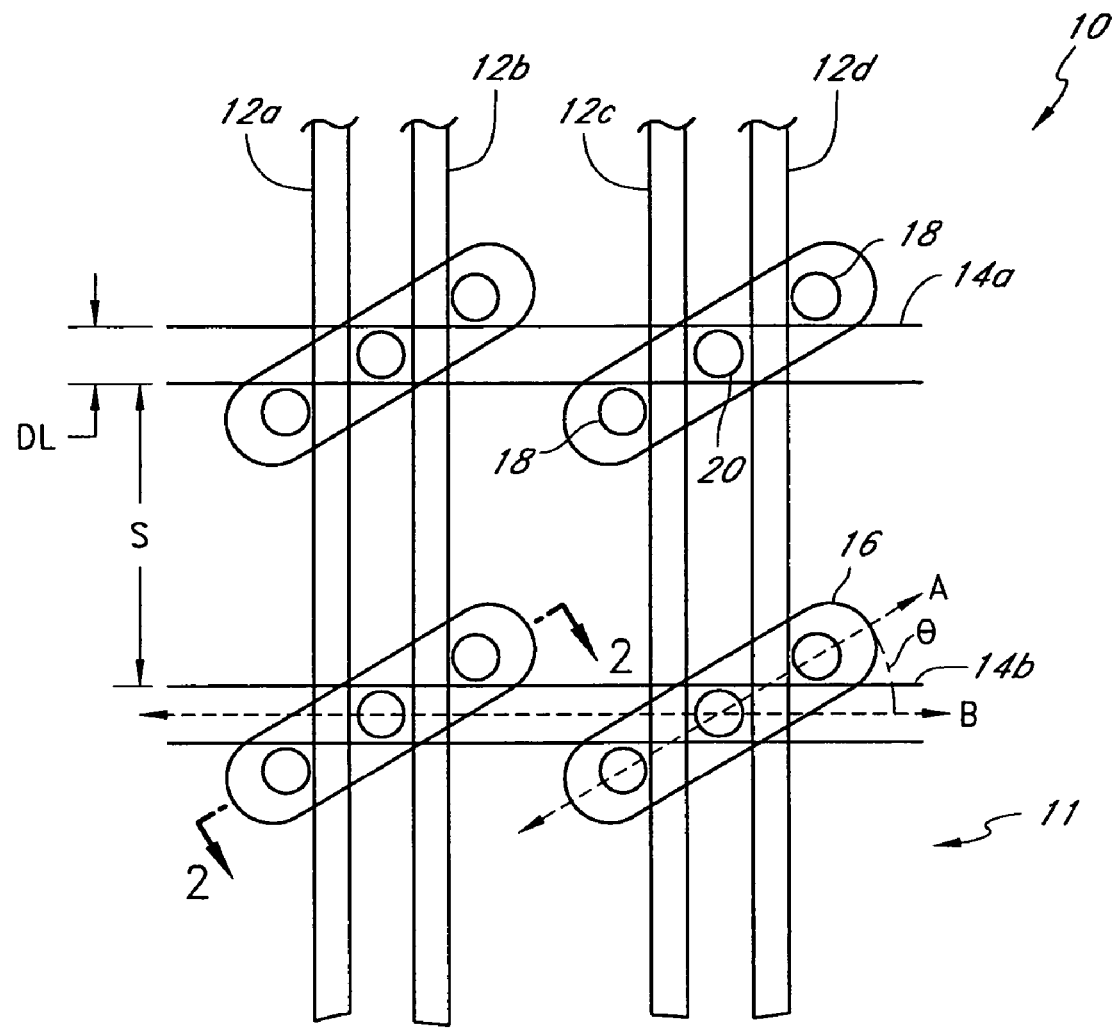
FIG. 1 is a schematic plan view of a memory device, laid out in accordance with a preferred embodiment of the invention.

FIG. 1 shows a view of a portion of a memory device 10. This schematic layout illustrates the various electrical devices and other components that form the memory device 10. Of course, many of these components would be indistinguishable in a purely visual representation, and some of the components shown in FIG. 1 are artificially distinguished from other components in order to highlight their functionality. The memory device 10 is built on and in a substrate 11, which forms the lowest level of semiconductor material in which electrical devices are formed. The substrate 11 typically comprises silicon. Of course, other suitable materials (e.g., other group III-V elements) may also be used, as is well-known to those skilled in the art. When describing the other components, their depth or height may be most easily understood with reference to the top surface of the substrate 11, best seen in FIG. 2.

Four elongate word lines 12a, 12b, 12c, 12d are also shown in FIG. 1 extending along the memory device 10. In a preferred embodiment, these word lines 12 were formed using a pitch doubling technique. In particular, these word lines 12 are preferably formed by a method that will be discussed in greater detail with reference to FIGS. 3-9. Using such a technique, the pitch of the resulting features may be less than the minimum pitch defined by the photolithographic technique. For example, in one embodiment, the pitch of the resulting features may equal one half the minimum pitch defined by the photolithographic technique.

In general, pitch doubling may be performed by the following sequence of steps, as is well understood by those skilled in the art. First, photolithography may be used to form a pattern of lines in a photoresist layer overlying a layer of an expendable material and a substrate. This photolithographic technique achieves a pitch between adjacent lines of 2F, as disclosed above, which pitch is limited by the optical characteristics of photolithography. In one embodiment, F is within the range of 60 to 100 nm. This range is typical for state-of-the-art photolithographic techniques used to define features. In one photolithography system, F equals approximately 86 nm, while, in another system, F equals approximately 78 nm.

The width of each line defined by photolithography is typically also defined as F, as would be well understood by those skilled in the art. The pattern may then be transferred by an etching step (preferably anisotropic) to the lower layer of expendable material, thereby forming placeholders, or mandrels in the lower layer. The photoresist lines can then be stripped, and the mandrels can be isotropically etched to increase the distance between neighboring mandrels. Preferably, the distance between the neighboring mandrels is increased from F to 3F/2. Alternatively, the isotropic "shrink" or "trim" etch could have been performed at the level of the resist. A conformal layer of spacer material may then be deposited over the mandrels. This layer of material covers both horizontal and vertical surfaces of the mandrels. Spacers, i.e., material extending from sidewalls of another material, are therefore formed on the sides of the mandrels by preferentially etching the spacer material from the horizontal surfaces in a directional spacer etch. The remaining mandrels are then selectively removed, leaving behind only the spacers, which together may act as a mask for patterning. Thus, where a given pitch, 2F, formerly included a pattern defining one feature and one space, the same width now includes two features and two spaces defined by the spacers. As a result, the smallest feature size achievable with a given photolithographic technique is effectively decreased. This method of pitch doubling, which may be repeated for further reduction in the size of the features, will be discussed in greater detail below with reference to FIGS. 3-9.

Of course, as would be well known in the art, the extent of the shrink/trim etch and the thicknesses of the deposited spacers may be varied to achieve a variety of feature and pitch sizes. In the illustrated embodiments, whereas the photolithographic technique may resolve a pitch of 2F, the features, i.e. word lines 12 in the instant example, have a pitch of F. The word lines 12 are defined by a width of about F/2, and adjacent word lines 12a, 12b or 12c, 12d are separated by the same width, F/2. Meanwhile, as a byproduct of the pitch-doubling technique, the separation between the spaced-apart word lines 12b, 12c is 3F/2. In a preferred embodiment, an isolation trench is filled with an insulator and lies within this separation between these word lines 12b, 12c; however, in other embodiments, this isolation trench need not be present.

For every distance of 3F, there are two word lines, yielding what may be referred to as an effective pitch of 3F/2. More generally, the word lines preferably have an effective pitch between 1.25F and 1.9F. Of course, the particular pitch used to define the word lines is only an example. In other embodiments, the word lines may be fabricated by more conventional techniques, and pitch doubling need not be used. In one embodiment, for example, the word lines may each have a width of F and may be separated by F, 2F, 3F or some other width. In still other embodiments, the word lines need not be formed in pairs either. For example, in one embodiment, only one word line need pass through each active area.

The entire length of the word lines 12 is not visible in FIG. 1, but, in a typical implementation, each word line 12 may extend across hundreds, thousands or millions of transistors. At the edges of the word lines 12, as is well-known to those of skill in the art, the word lines 12 are typically electrically coupled to a device, such as a power source, that can place a current across the word line 12. Often, the power sources for the word lines 12 are indirectly coupled to a CPU through a memory controller.

In one embodiment, the word lines 12 comprise a p-type semiconductor, such as silicon doped with boron. In other embodiments, the word lines 12 may comprise an n-type semiconductor, metal silicide, tungsten or other similarly behaving material, as is well-known to those of skill in the art. In some embodiments, the word lines 12 may comprise a variety of materials, in a layered, mixed or chemically bonded configuration.

The horizontal lines seen in FIG. 1 are formed by digit lines 14a, 14b. In one exemplary embodiment, the width of each of these digit lines, illustrated as DL in FIG. 1, is equal to F. No pitch doubling has been used to form these exemplary digit lines 14. Adjacent digit lines 14a, 14b are separated, in a preferred embodiment, by a distance, illustrated as S in FIG. 1, equal to 2F. The pitch of the digit lines is preferably greater than 2.5F, and preferably less than 4F. Without pitch-doubling techniques, the lower limit is, of course, imposed by the photolithographic technique used to form the digit lines. On the other hand, near the upper end of this range, the photolithography is less precise, and therefore less expensive, but the memory itself begins to grow too large. In a more preferred embodiment, the pitch of the digit lines is between 2.75F and 3.25F. This range represents a desirable balance between the ease of manufacturing and the size of the chip. In the illustrated embodiment, the digit lines 14 have a pitch of 3F. Of course, in other embodiments, different widths and spacing are possible.

As with the word lines 12, the entire length of the digit lines 14 is also not visible in FIG. 1, and the digit lines 14 typically extend across many transistors. At the edges of the digit lines 14, as is well-known to those of skill in the art, the digit lines 14 are typically electrically coupled to current sense amplifiers, and thereby to a power or voltage source. Often, the power sources for the digit lines 14 are also indirectly coupled to a CPU through a memory controller. As a result of the more relaxed pitch between the digit lines 14, the sense amplifiers may be spaced farther from one another, relaxing their manufacturing tolerances, and decreasing the likelihood of capacitance coupling of adjacent digit signals.

In one embodiment, the digit lines 14 comprise a conducting metal, such as tungsten, copper, or silver. In other embodiments, other conductors or semiconductors may be used, as is well-known to those of skill in the art.

The other features visible in FIG. 1 are the active areas 16, illustrated within curvilinear rectangles, which form axes A that are angled relative to the axes B of the digit lines. These rectangles represent a doped region or well within the substrate 11; however, in other embodiments, these rectangles need not represent physical structures or materials within or upon the memory device 10 and substrate 11. The active areas 16 define those portions of the memory device 10 that contain field effect transistors and are typically surrounded by field isolation elements (e.g., shallow trench isolation (STI)). In one preferred embodiment, these active areas each comprise two drains 18 and one source 20. The source and drains may be larger or smaller than illustrated in FIG. 1, as is well known to those of skill in the art. They may also be fabricated in any of a number of ways well-known to those of skill in the art.

In another embodiment, the active areas may comprise one source and one drain, wherein the source is formed near the digit line, and the drain is separated from the source by a word line. In such an embodiment, the memory device may be configured similarly to the memory device 10 in FIG. 1, but there need only be one word line passing through each active area. Of course, in another embodiment, an active area may comprise one source and one drain, and the memory device may further comprise two word lines extending near the active area, configured similarly to the paired word lines 12c, 12d shown in FIG. 1. In such an embodiment, the two word lines may both extend between the source and drain, and provide redundant control of the transistor.

As illustrated, a digit line 14 runs proximal to, and preferably above (see FIG. 2), each source 20 that lies in the digit line's row. Meanwhile, each source 20 is separated to either side from its adjacent drains 18 by word lines 12. In one embodiment, the source 20 and drains 18 comprise an n-type semiconducting material, such as silicon doped with phosphorous or antimony. In other embodiments, the source 20 and drains 18 may comprise a p-type semiconductor, or they may be fabricated from other materials, as is well-known to those of skill in the art. In fact, the source 20 and drains 18 need not be fabricated from the same compounds.

The functioning of memory device 10 is briefly discussed with reference to FIG. 2, which shows a cross-sectional view of one of the active areas 16. For a further discussion of the basic manner in which DRAMs function, U.S. Pat. No. 3,731,287, issued to Seely et al., which is incorporated by reference herein in its entirety, discusses DRAMs in greater detail.

Figure 2:
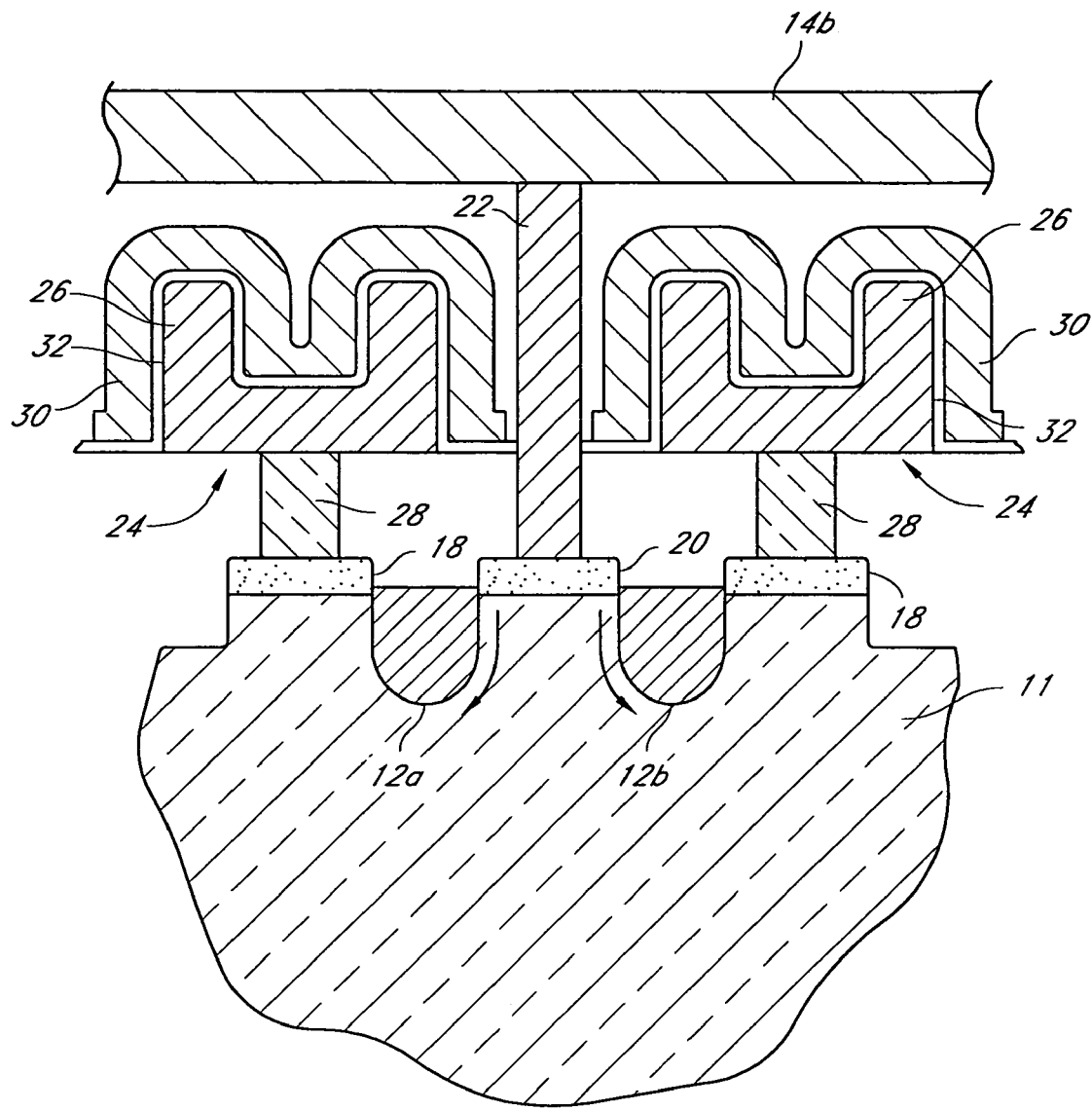
FIG. 2 is a schematic, cross-sectional side view of the memory device of FIG. 1 taken along lines 2-2, in accordance with a preferred embodiment of the invention.

As shown in FIG. 2, the drains 18 and source 20 may comprise protrusions from the relatively flat, upper surface of the substrate 11. In one preferred embodiment, the source 20 and drains 18 are fabricated as one-piece with the substrate 11, and are raised relative to the surface of the substrate 11 by etching a monolithic wafer or substrate; in another arrangement, the source and drain protrusions are formed by selective epitaxial deposition using techniques well-known to those of skill in the art.

In one embodiment, at least a portion of digit line 14b is located above the upper surface of source 20. As illustrated in FIG. 2, the source 20 is electrically coupled to the digit line 14b by a digit line plug 22, which plug may be formed in multiple stages or in a single stage, as shown. Meanwhile, the source 20 is separated from the two drains 18 by word lines 12a, 12b. The word lines 12a, 12b are preferably embedded in the substrate 11, extending downwards from the surface. Transistors of this design are often referred to as recessed access devices or RADs. The drains 18 are, in turn, electrically coupled to storage capacitors 24, and, in particular, to the lower electrode 26 of the storage capacitors 24, by contact plugs 28. In a preferred embodiment, the storage capacitors 24 comprise a lower electrode 26 separated from a reference electrode 30 by a dielectric material 32. In this configuration, these stacked storage capacitors 24 function in a manner well known to those of skill in the art. As illustrated, the storage capacitors 24 are preferably located above the plane of the substrate 11, although trench capacitors can be used in other arrangements.

In one embodiment, one side of every storage capacitor 24 forms a reference electrode 30, while the lower electrode 26 is electrically coupled to an associated drain 18. The word lines 12a, 12b function as gates in the field effect transistors they pass through, while the digit line 14b functions as a signal for the sources to which it is electrically coupled. Thus, the word lines 12a, 12b preferably control access to the storage capacitors 24 coupled to each drain 18, by allowing or preventing the signal (representing a logic "0" or a logic "1") carried on the digit line 14b to be written to or read from the storage capacitors 24. Thus, each of the two capacitors 24 connected to an associated drain 18 can contain one bit of data (i.e., a logic "0" or logic "1"). In a memory array, the combination of the digit line and word line that are selected can uniquely identify the storage capacitor 24 to or from which data should be written or read.

Turning back then to FIG. 1, the design and geometry of the memory device 10 may be discussed in further detail. In the lower right hand corner of FIG. 1, a number of axes have been illustrated. These axes are generally aligned with the longitudinal axes of circuit elements forming the memory device 10, and are illustrated to more clearly show the angles formed between various electrical devices and components. Axis A represents the longitudinal axis of active area 16. The drains 18 and source 20 of each active area 16 preferably have a substantially linear relationship that may be used to define a longitudinal axis. As illustrated, all of the active areas 16 are substantially parallel. It will be understood, of course, that the drains 18 and source 20 need not form an absolutely straight line, and indeed a substantial angle may be defined by these three points. In some embodiments, therefore, the axis A may be defined by the two drains 18, or by the source 20 and only one of the drains 18, or in a number of other ways that would be clearly understood by those skilled in the art. In other embodiments, in which the active area comprises a single drain and a single source, the axis A may be defined by a line between the single drain and single source.

Axis B represents the longitudinal axis of digit line 14b. In the illustrated embodiment, the digit line 14b forms a substantially straight line. Just as the active areas 16 are preferably parallel, the digit lines 14a, 14b also preferably form generally parallel axes. Thus, in a preferred embodiment, axis A of every active area 16 forms a similar angle with every axis B of the digit lines 14, at least in the region of each memory cell.

In a preferred embodiment, illustrated in FIG. 1, an acute angle is formed between axis A and axis B. In the illustrated embodiment, this acute angle, θ, defined between axis A and axis B, is 45°.

The angling of the active areas 16 relative to the digit lines 14 facilitates the location of the contact plugs 28 extending between drains 18 and associated storage capacitors 24. Since these contact plugs 28 extend from the top surface of the drains 18 in the preferred embodiment (illustrated in FIG. 2), the engineering is simplified if the digit lines 14 do not extend over the tops of the drains 18. By angling the active areas 16, the distance between a digit line 14 and drains 18 may be selected to facilitate electronic contact between the drains and contact plugs, even while the digit line 14 substantially overlaps and contacts the source 20 of the same active area 16.

Of course, the angle, θ, may have any of a number of values chosen to maximize the pitch of the electrical devices. As will be readily apparent to one of skill in the art, different angles will yield different pitches between adjacent active areas. In one embodiment, the angle, θ, is preferably between 10° and 80° degrees. In a more preferred embodiment, the angle, θ, is between 20° and 60°. In a still more preferred embodiment, the angle, θ, is between 40° and 50°.

Figure 3:
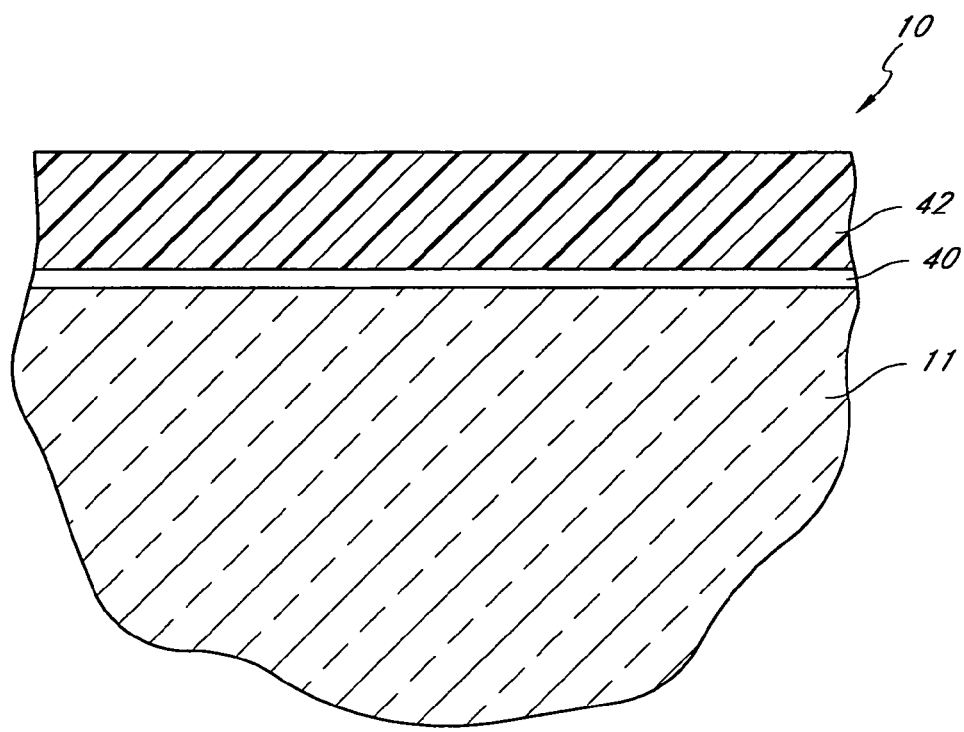
FIGS. 3-7 are a series of cross-sectional views of a portion of a semiconductor device, illustrating formation of DRAM access transistors similar to those of FIGS. 1 and 2, according to a preferred embodiment of the present invention.
Figure 4:
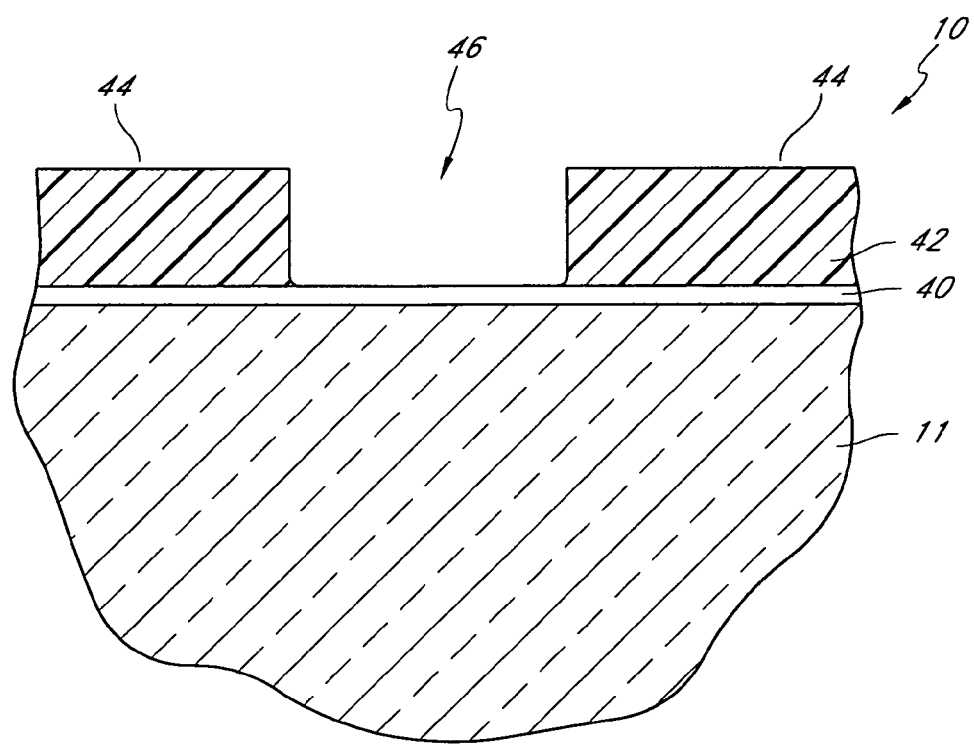

Turning to FIGS. 3-10, one method of fabricating the pitch-doubled word lines 12 of the memory device 10 is illustrated in greater detail. The skilled artisan will readily appreciate that the particular materials of the illustrated embodiment can be replaced individually or in combination with other groups of materials. FIG. 3 illustrates a semiconductor substrate 11 over which a thin, temporary layer 40, comprising oxide in a preferred embodiment, has been formed according to conventional semiconductor processing techniques. A hard mask layer 42, such as silicon nitride, is then deposited over the substrate 11 and temporary layer 40. The hard mask layer 42 may be formed by any well-known deposition process, such as sputtering, chemical vapor deposition (CVD) or low-temperature deposition, among others. Although the hard mask layer 42 comprises silicon nitride in the preferred embodiment, it must be understood that it may also be formed of silicon oxide, for example, or other materials suitable for the selective etch steps described below.

Next, in a step not illustrated in the figures, the hard mask layer 42 is patterned using a photoresist layer formed over the hard mask layer 42. The photoresist layer may be patterned to form a mask using conventional photolithographic techniques, and the hard mask layer 42 may then be anisotropically etched through the patterned photoresist to obtain a plurality of hard mask columns 44 extending in the y-dimension (as defined by FIG. 1), with trenches 46 separating those columns. The photoresist layer may then be removed by conventional techniques, such as by using an oxygen-based plasma.

Figure 5A:
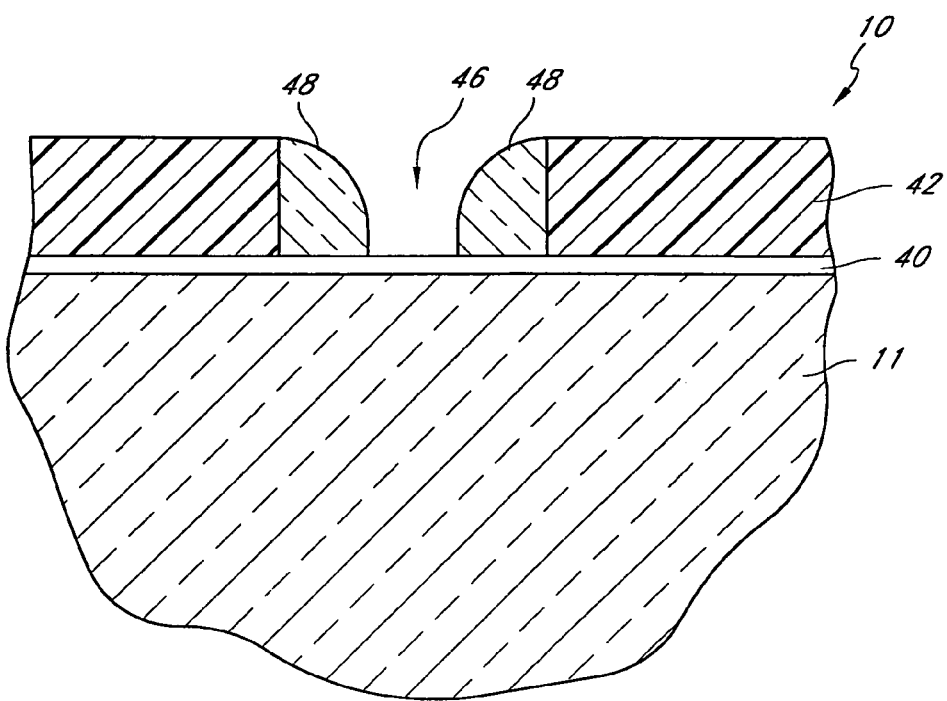

With reference to FIG. 5A, after the trenches 46 have been formed in the hard mask layer 42, a conformal layer of spacer material may be deposited to cover the entire surface of the memory device 10. Preferably, the spacer material can be selectively etched with respect to the substrate 11 and the temporary layer 40, and the substrate 11 and the temporary layer 40 can each be selectively etched with respect to the spacer material. In the illustrated embodiment, the spacer material comprises polysilicon. The spacer material may be deposited using any suitable deposition process, such as, for example, CVD or physical vapor deposition (PVD).

After laying the spacer material over the vertical and horizontal surfaces of the memory device 10, an anisotropic etch may be used to preferentially remove the spacer material from the horizontal surfaces in a directional spacer etch. Thus, the spacer material is formed into spacers 48, i.e., material extending from the sidewalls of another material. As shown in FIG. 5A, spacers 48 are formed within the trench 46 and narrow it.

Figure 5B:
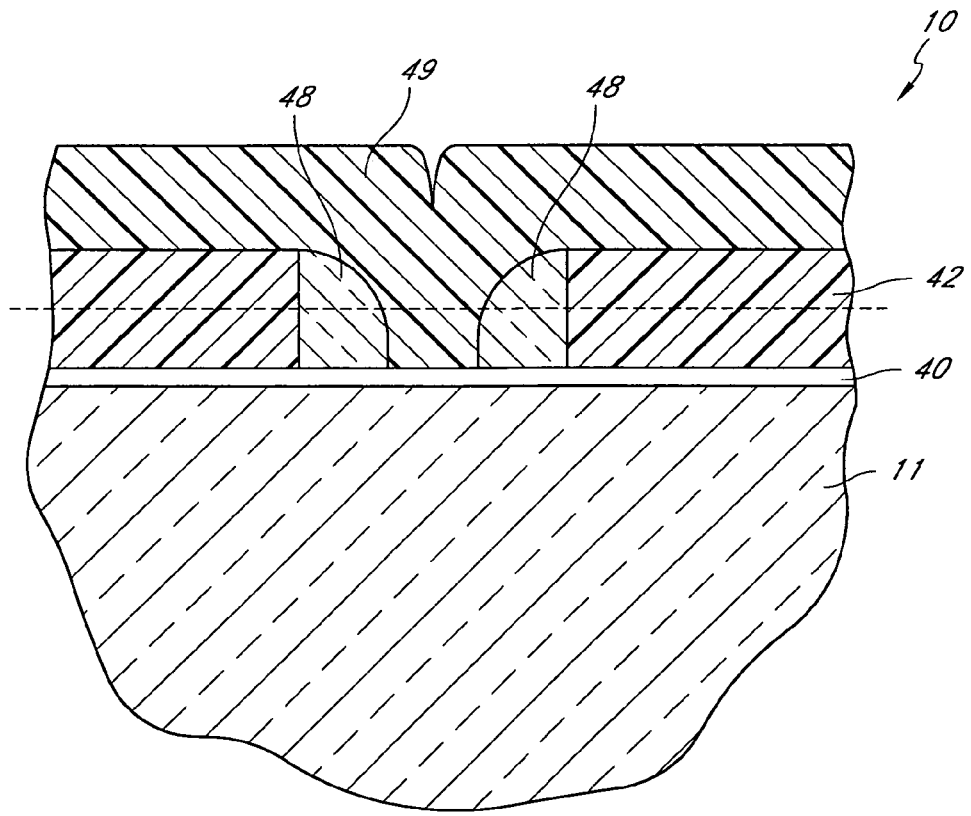

With reference to FIG. 5B, a second hard mask layer 49 may then be deposited over the entire surface of the memory device 10. This layer of hard mask 49, also silicon nitride in a preferred embodiment, is preferably deposited to a thickness sufficient to fill the trench 46. Of course, the hard mask material 49 may be deposited by any of a number of suitable deposition processes, including CVD or PVD. After deposition of a sufficient amount of hard mask material 49, the excess that may have formed over the spacers 48 and over the other portions of previously deposited hard mask 42 may be removed by any of a number of processes well-known to those of skill in the art. For example, the surface of the device 10 may be planarized to the level of the dotted line of FIG. 5B, such that the sidewalls of the remaining spacers 48 are nearly vertical. Any suitable planarization process, such as, for example, chemical mechanical planarization may be used.

The spacers 48 that are now exposed at the top surface of the memory device 10 may be stripped using any of a number of processes. In the illustrated embodiment, a process may be used that selectively strips polysilicon relative to silicon nitride. For example, in one embodiment, a selective wet etch may be used. The trenches formed where the spacers 48 have been etched are further deepened by a secondary etch that selectively etches the temporary layer 40 as well as the substrate 11. These trenches are also preferably formed using a directional process, such as, for example, ion milling or reactive ion etching.

Figure 6:
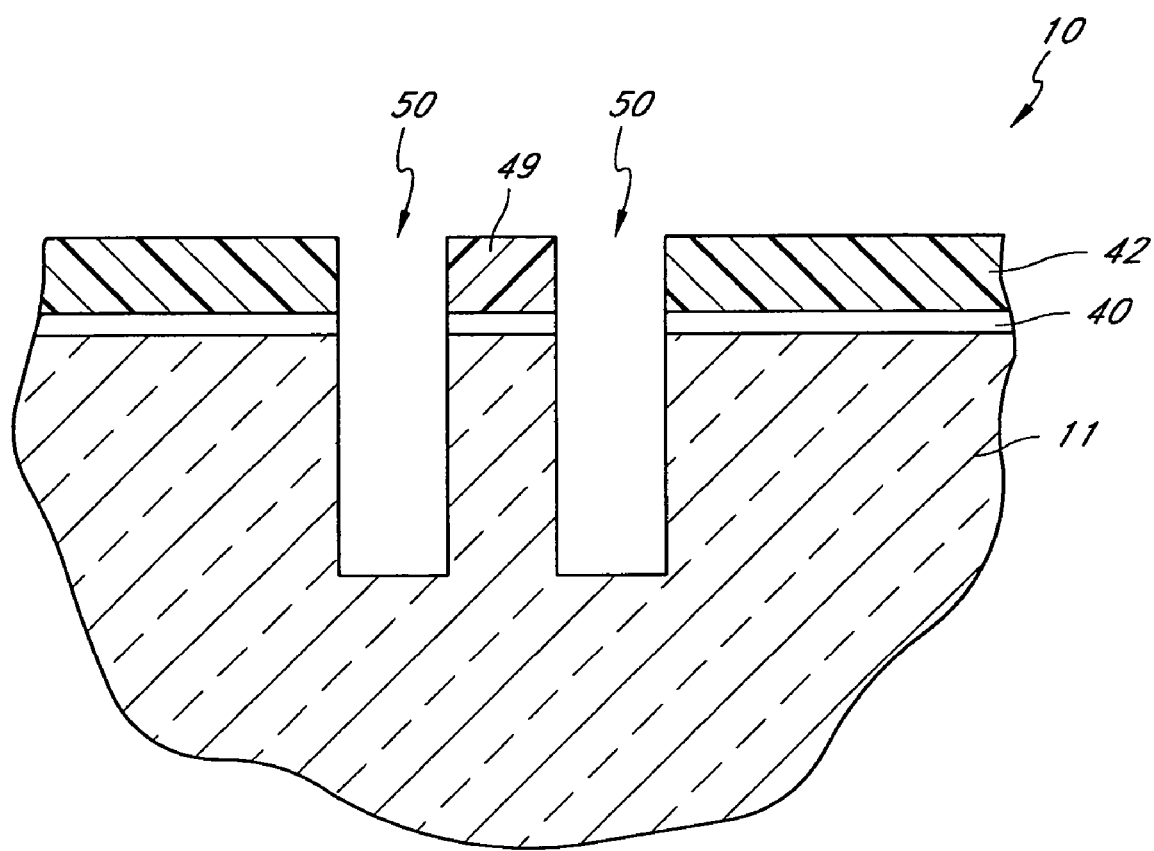

FIG. 6 illustrates the result of these processes, with openings or recesses in the form of trenches 50 separated by less than the minimum pitch possible using photolithographic techniques alone. Preferably the trenches 50 have a width at top between about 25 nm and 75 nm. Of course, a skilled artisan will appreciate that numerous other techniques for pitch multiplication may be used to arrive at the stage shown in FIG. 6. Many such techniques will generally include a spacer process, by which physical deposition can achieve a smaller pitch than photolithographic techniques alone. The trenches 50 typically also have an aspect ratio greater than 1:1, and preferably greater than 2:1. Increased depth maximizes available volume and thence conductivity for the word lines, at the expense of difficulty in filling with a suitable material.

Figure 7:
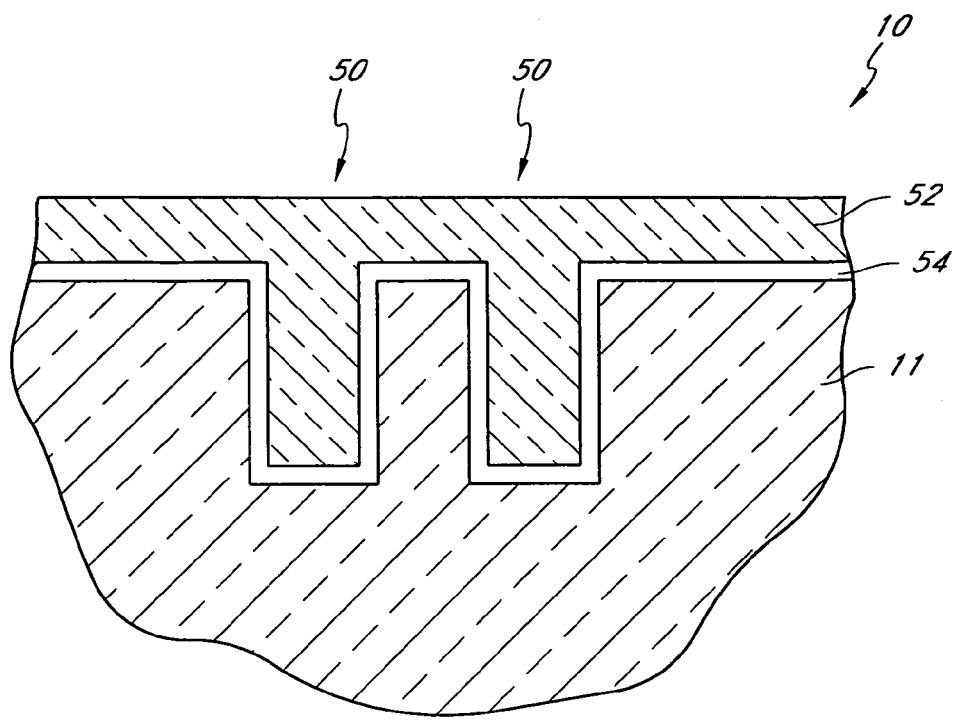

After formation of these trenches 50, the hard mask layer 42 is selectively stripped, by any of a number of methods well known to those of skill in the art. In FIG. 7, a gate dielectric layer 54 is blanket deposited or thermally grown over the device, lining the inner surfaces of the trenches 50. The illustrated gate dielectric layer 54 comprises silicon oxide formed by thermal oxidation in a preferred embodiment, but can also be a deposited high K material in other embodiments. A layer of gate material 52, which comprises polysilicon in the illustrated embodiment, may then also be blanket deposited over the entire memory device 10. In one embodiment, the gate layer 52 completely fills the trenches 50 and forms a top surface of the device 10. In a preferred embodiment, this polysilicon is undoped.

Figure 8:
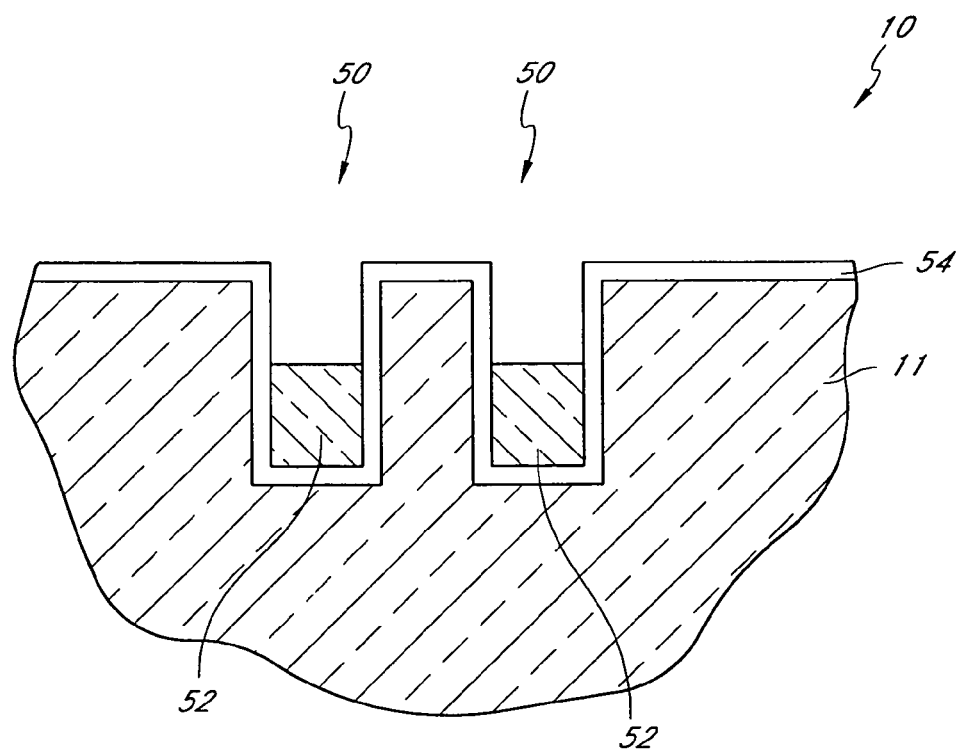
FIG. 8 is a schematic, cross-sectional view of the device of FIG. 7 after recessing silicon within the trench, and prior to deposition of metal for silicidation, in accordance with one embodiment of the present invention.
Figure 9:
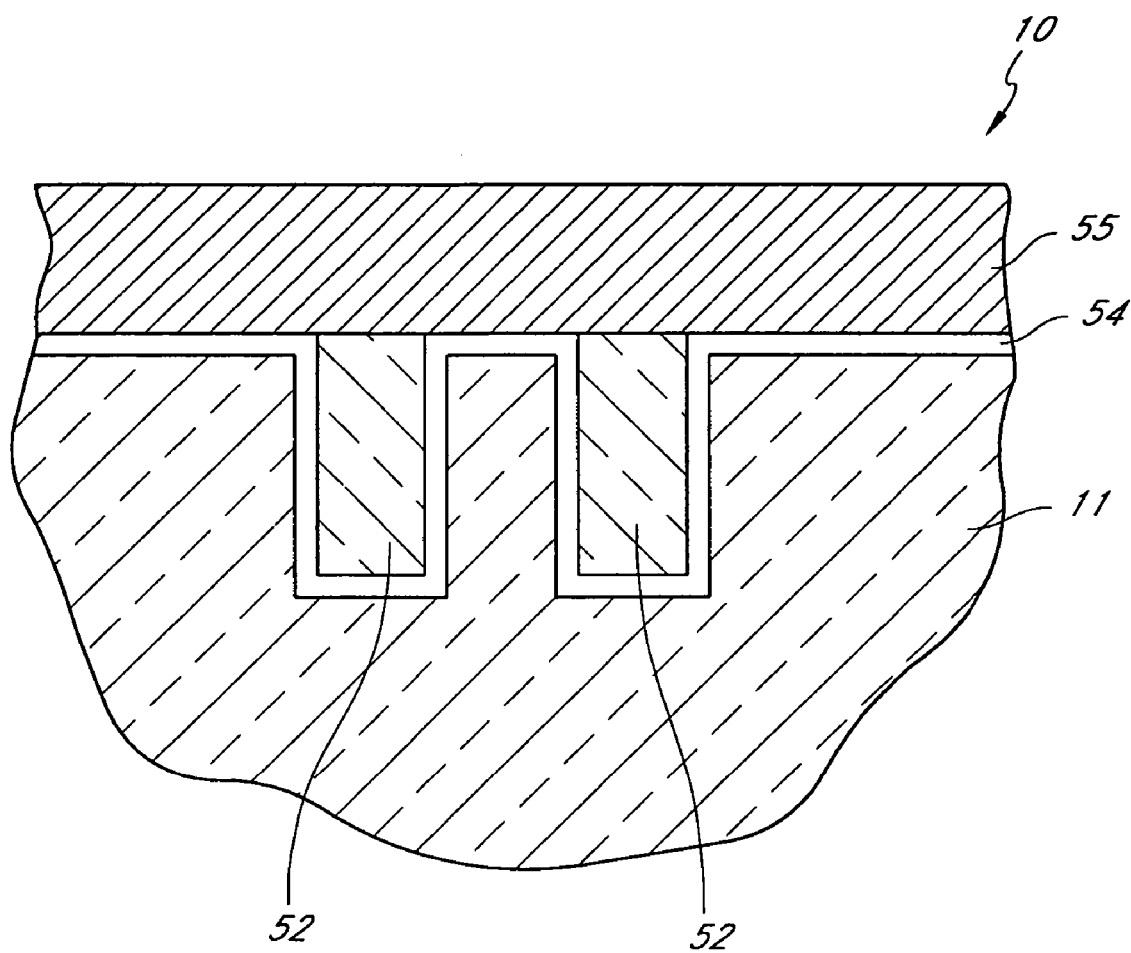
FIG. 9 is a schematic, cross-sectional view of the device of FIG. 7 after planarizing silicon within the trench and depositing metal for silicidation, in accordance with another embodiment of the present invention.

After a series of doping steps to define the drains and sources of transistors, the undoped polysilicon in the trenches 50 is etched back until the top of the gate layer 52 resides beneath the top surface of the substrate 11. This stage of the process is shown in FIG. 8. The recessed polysilicon 52 of FIG. 8 can serve as the word lines and the gate electrodes for the memory cell transistors if appropriately doped.

Preferably, however, the gate electrodes in the arrays are formed of a more highly conductive material than traditional polysilicon gates. This is due to the fact that the recessed gates 12 (see FIGS. 1 and 2) are more narrow than the typical gate electrode. Metallic materials compensate, in whole or in part, for the small volume of the gates in the array, improving lateral signal propagation speed along the word lines. Thus, the undoped polysilicon of FIG. 8 can be silicided after recessing by depositing metal thereover and reacting. Metal silicide can have better than 10 times the conductivity of doped polysilicon and demonstrate a suitable work function.

With reference to FIGS. 9-12, in another arrangement, rather than being recessed, the polysilicon 52 is initially etched back or planarized down to the gate oxide 54, thus isolating the polysilicon within the trenches 50 without recessing at this stage. The polysilicon of the gate layer 52 within the trenches 50 is subjected to a salicidation (self-aligned silicidation) reaction to form a layer of conductive material 56. A metal layer 55 (FIG. 9) may be blanket deposited and an anneal step may form a silicide material 56 (FIG. 12) wherever the metal contacts silicon, such as over the polysilicon gate layers 52. In one embodiment, the silicided material comprises silicon and one or more metals, such as, for example, tungsten, titanium, ruthenium, tantalum, cobalt or nickel. A selective metal etch removes the excess metal but does not remove the silicide 56. The metal silicide 56 thereby forms a self-aligned layer that increases the lateral conductivity along the word line.

Preferably, the gate layer 52 is fully silicided to maximize lateral conductivity. Full reaction also assures silicide formation down to the bottom of the trenches 50. In the illustrated recessed access devices (RADs), the channel extends across not only along the bottom of the gate, but also along the gate's sidewalls. Accordingly, incomplete silicidation would result in different work functions along the length of the RAD channel. Furthermore, full silicidation ensures similar gate work functions across the array, from array to array across a wafer, and from wafer to wafer. It has been found difficult, however, to achieve full silicidation within the tight confines of the illustrated trenches 50, with a single metal to form the conductive material 56. Either nickel or cobalt, for example, tends to form voids in the high-aspect ratio trenches 50. Other metals have demonstrated similar difficulties for full silicidation for recessed access devices. The skilled artisan will appreciate that full silicidation can be challenging for material within other types of recesses, such as contact openings or vias, stacked container shapes for capacitors, capacitor trenches, etc.

Without wanting to be bound by theory, the voiding appears to be caused by diffusion during the silicidation reaction, in combination with the tight confines of the high aspect ratio trenches 50. Silicon diffuses more readily in cobalt than cobalt does into silicon. Accordingly, silicon tends to migrate during the reaction, leaving voids in the trenches 50. Furthermore, a high temperature phase transformation anneal may convert the silicide from CoSi to the more stable CoSi2. Nickel, on the other hand, diffuses more readily into silicon than silicon does into nickel and so also has a tendency to create voids during the reaction in which NiSi is converted into the NiSi2 phase.

Accordingly, the metal layer 55 preferably comprises a mixture of metals, where at least two of the metals in the mixture have opposing diffusivities relative to silicon. For example, the metal layer 55 can comprise a mixture of nickel and cobalt, such that the directions of diffusion tend to balance each other and minimize the risk of voiding. In this example, the cobalt preferably comprises less than 50 at. % of the mixed metal 55, and more preferably the mixture comprises about 70-90 at % Ni and about 10-30 at % Co. Such a mixture of nickel and cobalt has been found to more readily accomplish full silicidation of the gate layer without voiding, thus increasing signal propagation speeds along the word line. In contrast to partial silicidation, fully silicided word lines are not only more conductive, but also will ensure consistent work function along the length of the channel. Full silicidation will also demonstrate better consistency from device to device across an array, from array to array, or wafer to wafer, since partial silicidation will tend to leave inconsistent compositions depending upon local temperature variations, etc.

In one example, a sputtering target comprising 80% Ni and 20% Co is sputtered over the polysilicon 52 to produce the metal layer 55. The substrate is then subjected to a silicidation anneal. While a high temperature (e.g., 800° C.) anneal is possible for a shorter time, preferably the anneal is conducted at lower temperatures for a longer time. For example, the substrate is annealed at 400-600° C. for 25-35 minutes. In experiments, the silicidation anneal was conducted in a batch furnace under an $N_2$ environment at 500° C. for 30 minutes.

In view of the disclosure herein, the skilled artisan can readily select other suitable mixtures of metals for full silicidation within trenches. Examples of metals that diffuse more readily in silicon than silicon does in that metal include Ni, Pt and Cu. Examples of metals in which silicon diffuses more readily than the metal diffuses in silicon include Co, Ti and Ta.

Figure 10A:
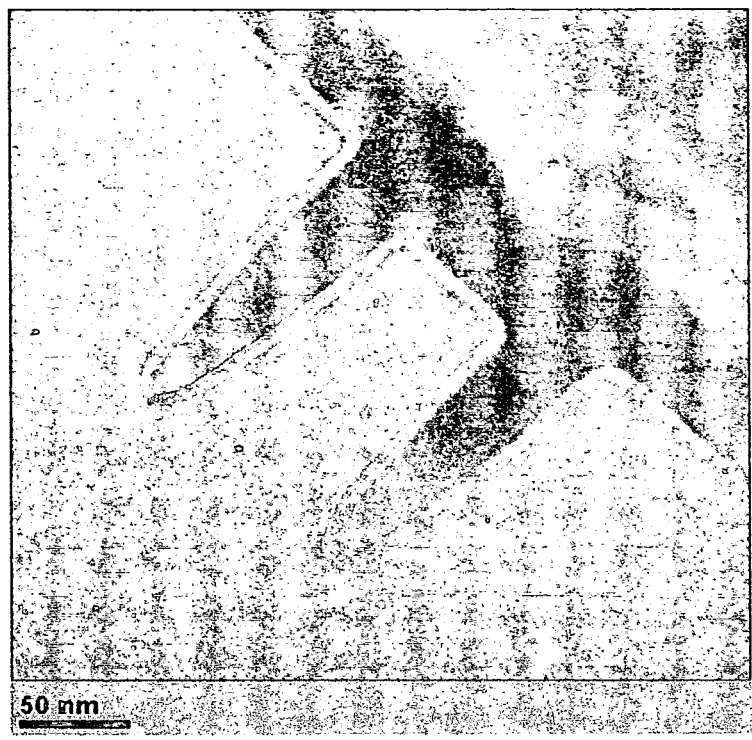
FIGS. 10A-11B are micrographs illustrating fully silicided, recessed gates for memory access devices after a silicidation anneal is performed on the device of FIG. 9.
Figure 10B:
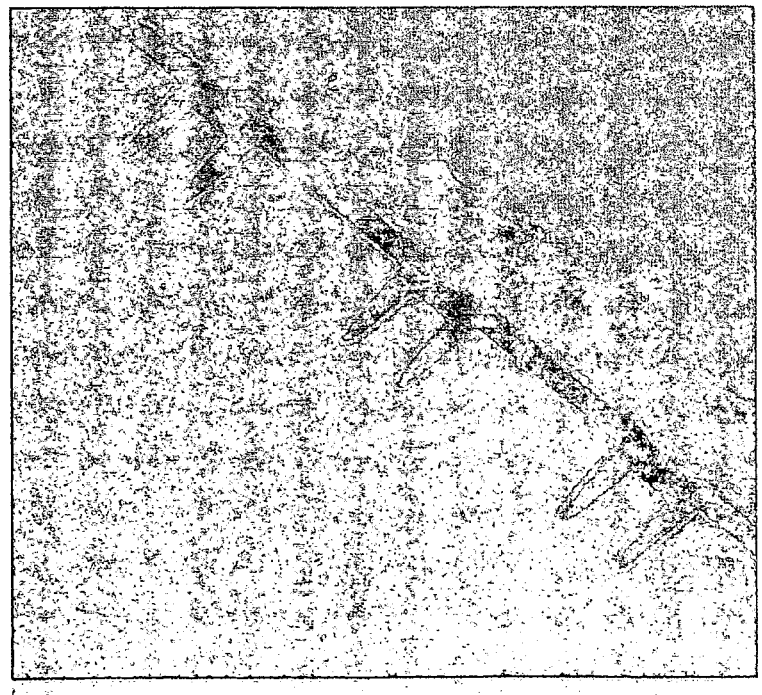
Figure 11A:
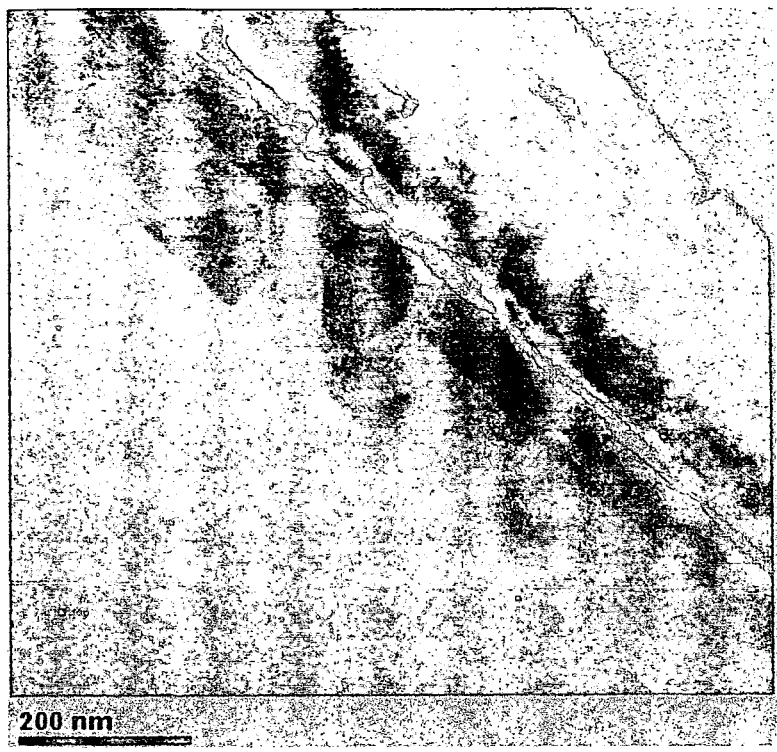
Figure 11B:
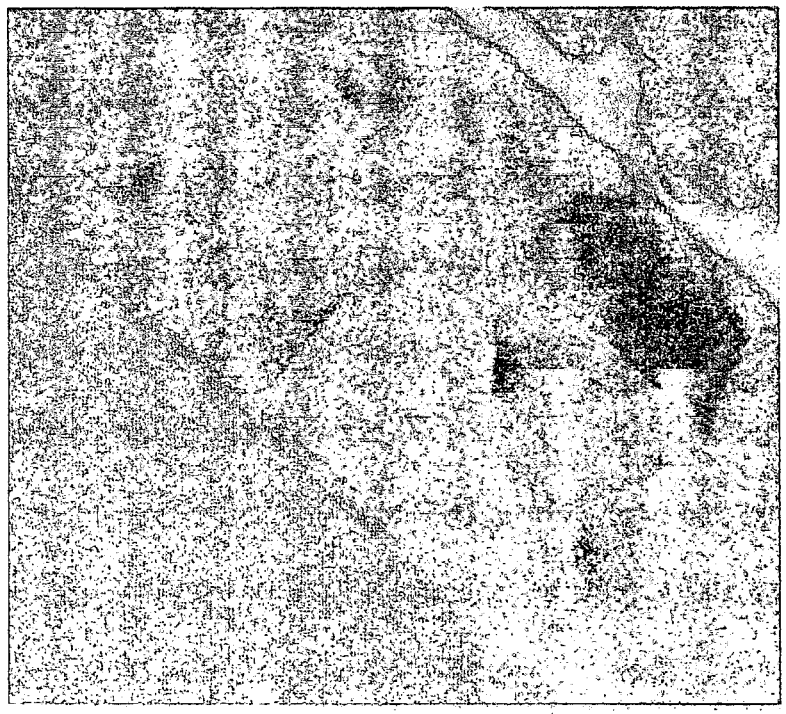
Figure 12:
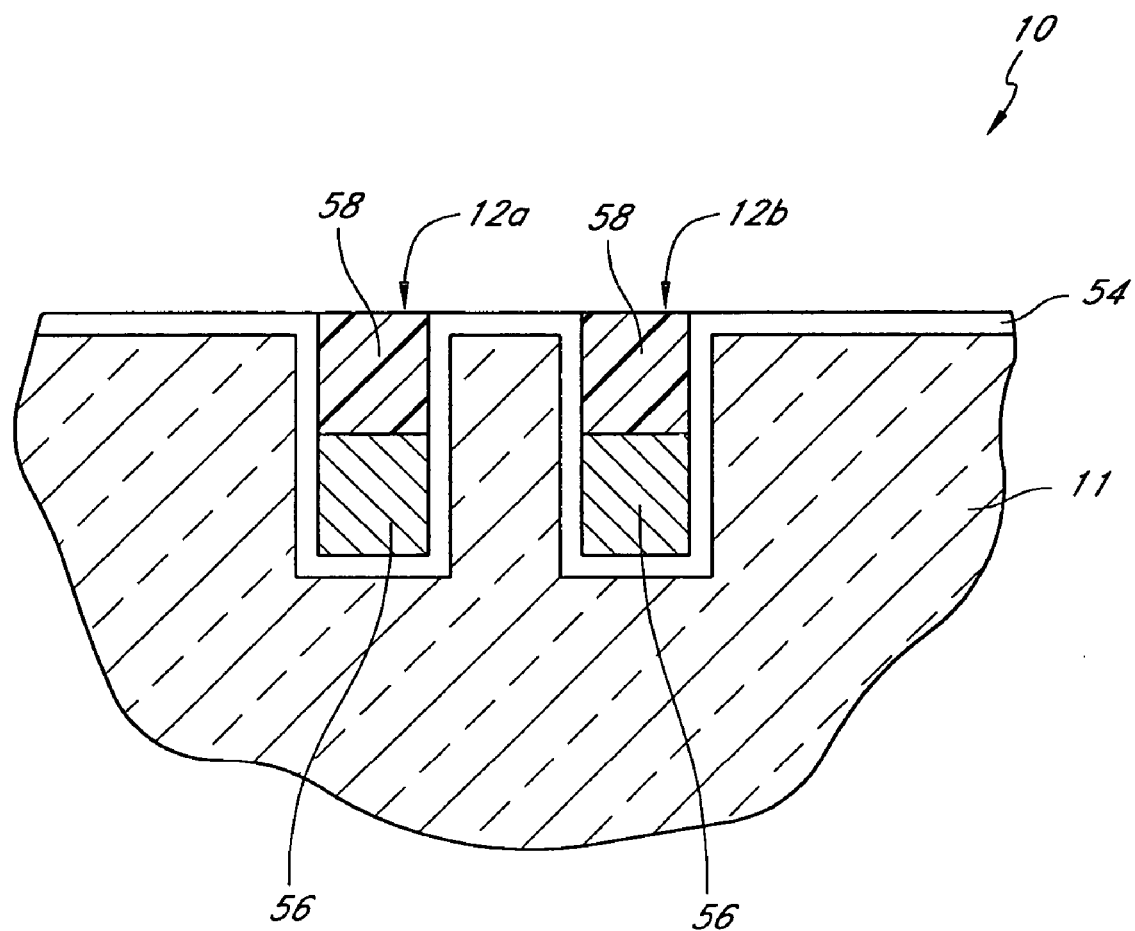
FIG. 12 is a schematic cross-section showing the partially fabricated semiconductor device of FIGS. 10A-11B after recessing and burying the fully silicided gates within their trenches.

FIGS. 10A-11B are micrographs showing recessed, fully silicided $Ni_xCo_ySi_z$ gate material within 50 nm wide trenches lined with silicon oxide. FIGS. 10A and 10B show cross sections across the width of twin trenches, at two different magnifications. FIGS. 11A and 11B show cross sections along the length of one of the trenches, at two different magnifications. The trenches have a width at the top of about 50 nm and a depth of about 150 nm, such that the aspect ratio of these trenches was about 3:1. A smooth, uniform composition is observed, filling at least a lower portion of the trenches without voiding. In the example of FIGS. 11-12, after depositing the polysilicon 52 (FIG. 7), the polysilicon can be etched back only to the gate dielectric top surface 54, thus isolating the silicon within the trenches without recessing.

Referring now to FIG. 12, the silicided layers 56 can be recessed within the trenches and are then covered by a second insulating layer 58, such as silicon nitride. These insulating layers 58 may be deposited and then etched or planarized. The conductive material 56 thereby forms the word lines 12a, 12b of the completed memory device 10, and the word lines 12a, 12b are separated from the other circuit elements by the insulating layers 58. Thus, as would be well understood by those of skill in the art, the word lines 12 have been pitch-multiplied, and have a pitch roughly one half of that possible simply using photolithographic techniques. Note, however, that certain aspects of the disclosure herein provide advantages whether or not the word lines are pitch-multiplied.

Of course, in other embodiments, the pitch-multiplication may take place by any of a variety of processes well-known to those skilled in the art.

The silicided layers 56 of the illustrated embodiment thus fill lower portions of the trenches 50, preferably filling greater than 50% of the trench heights, more preferably filling greater than 75% of the trench height. In the illustrated embodiment, about 70-90 at % of metal in the metal silicide 56 is nickel and about 10-30 at % of metal in the metal silicide is cobalt.

As will be appreciated by the skilled artisan, in a preferred embodiment, the logic in the periphery is preferably simultaneously defined as certain of the above steps are completed, thereby making the chip-making process more efficient. In particular, the silicon and metal deposition steps to define recessed word lines preferably simultaneously define gate electrodes over the substrate for the CMOS transistors in the periphery.

Referring to FIGS. 13-21, in accordance with another embodiment, different work functions and resistivity can be established for the simultaneously processed gate electrodes in the array and the logic regions in the periphery. In the illustrated embodiment, this is facilitated by etching array RAD trenches through a polysilicon layer, which forms part of the gate stack in the periphery.

Figure 13:
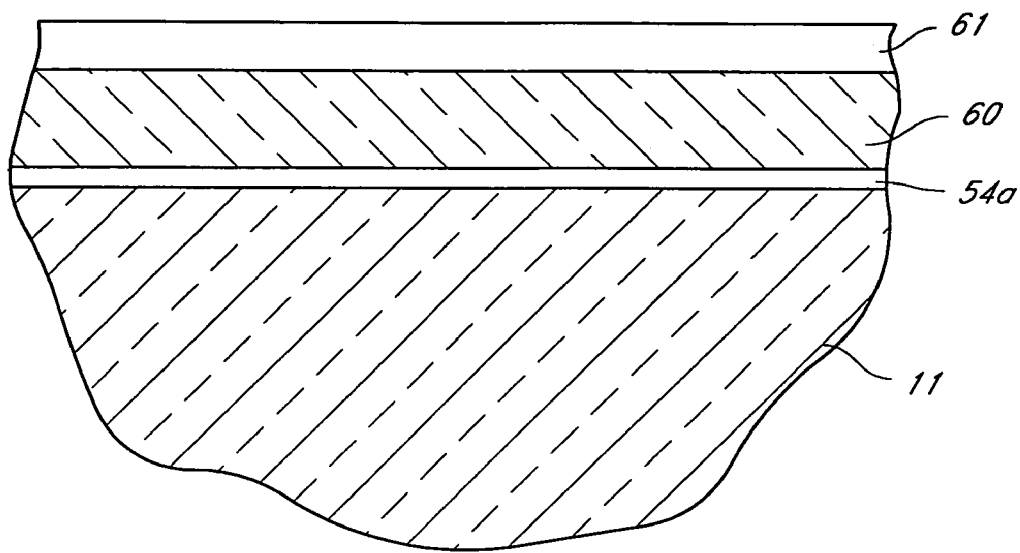
FIGS. 13-21 are a series of cross-sectional views of a portion of a semiconductor device, illustrating simultaneous formation of peripheral transistor gate stacks and recessed access devices (similar to those of FIGS. 1 and 2) in the array, according to another embodiment of the invention.

With reference to FIG. 13, a polysilicon layer 60 can be deposited over the substrate 11 prior to forming the trenches. The polysilicon layer 60 can be first deposited over a thin dielectric 54a (e.g., grown gate oxide). The substrate can then be patterned with a pitch-doubled mask (not shown), such as that described with respect to FIGS. 3-6. An etch stop layer 61 is also formed, in the illustrated embodiment comprising about 100-200 Å of TEOS-deposited oxide.

Figure 14:
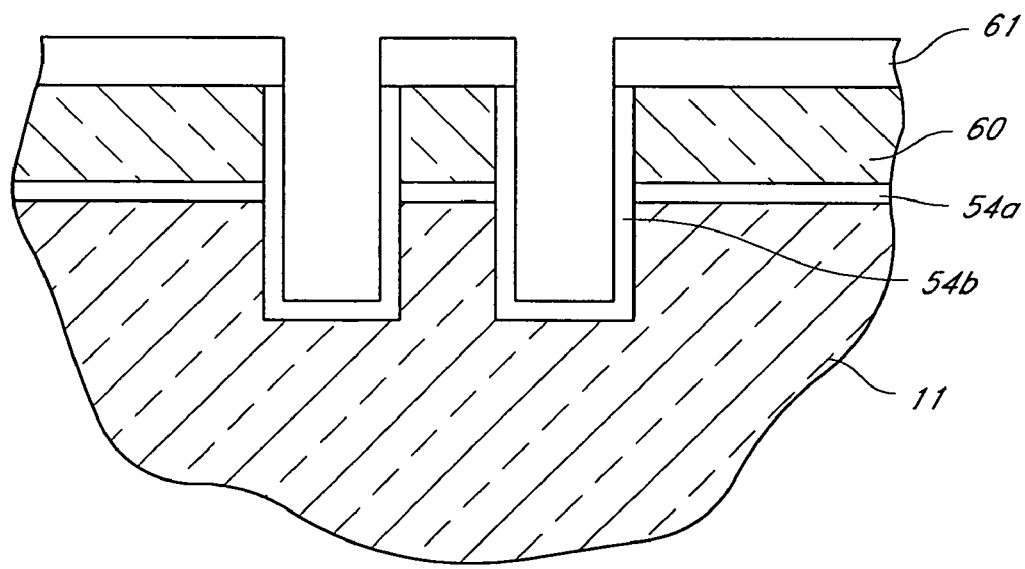

With reference to FIG. 14, the trenches 50 are etched through the overlying etch stop layer 61, the polysilicon layer 60, the underlying dielectric 54a and the substrate 11. The gate dielectric 54b can then be formed over the exposed portions of the substrate 11, such as by oxidation of the trench walls. Due to the pre-existing etch stop layer 61, no significant further oxide grows over the top surface of the polysilicon 60, as shown.

Figure 15:
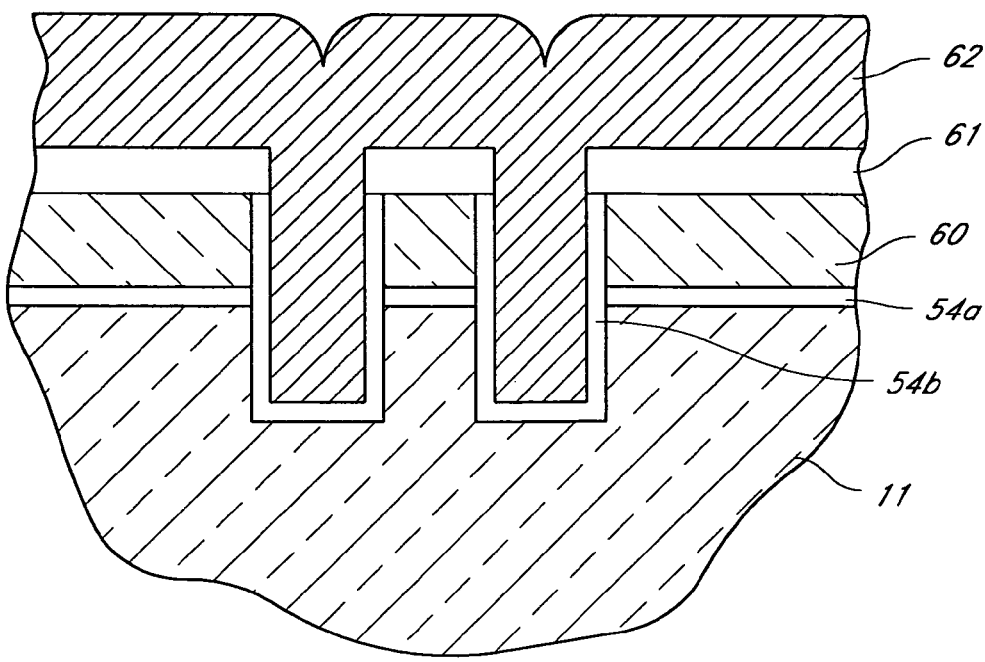

Subsequently, as shown in FIG. 15, a metallic material 62 can be deposited over the polysilicon 60 and into the trenches 50. As described with respect to FIGS. 9-12, the trenches 50 are preferably filled with material more conductive than polysilicon. In the illustrated embodiment, the metallic material 62 comprises titanium nitride (TiN).

Figure 16:
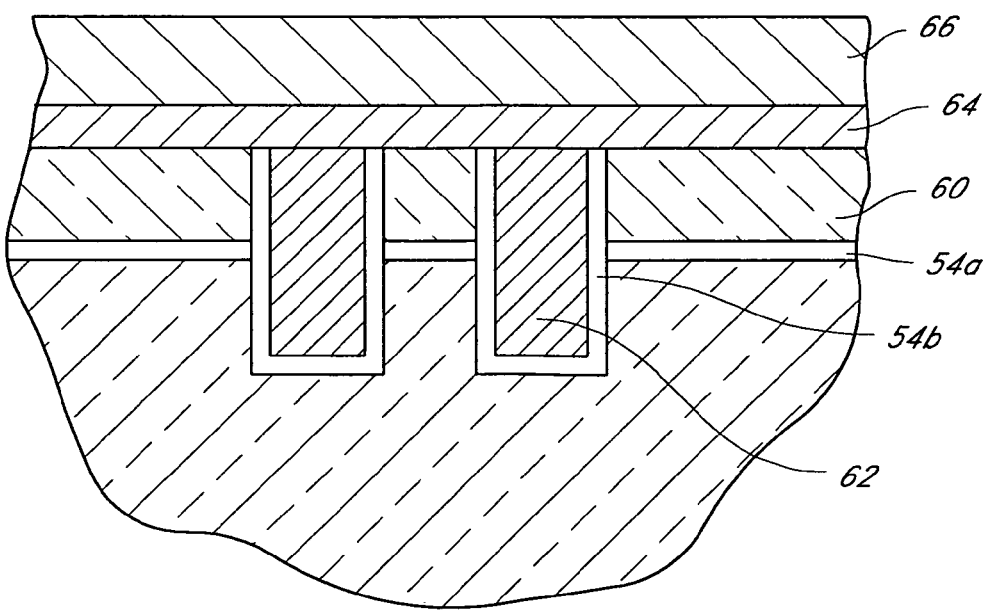

With reference to FIG. 16, the metallic material 62 is preferably etched back or planarized to leave isolated lines of the conductive material 62 in the trenches 50, stopping on the oxide etch stop layer 61 (see FIG. 15). Following etch back, the etch stop layer 61 overlying the polysilicon layer 60 is removed (e.g., using an HF dip for the preferred oxide material of the etch stop layer 61), while the dielectric layer 54b within the trenches 50 is protected by the metallic material 62. Subsequently, metallic layers 64, 66 are deposited over the silicon layer 60. As will be appreciated by the skilled artisan, the first dielectric layer 54a, the polysilicon layer 60, and the overlying metallic layers 64, 66 can serve as the transistor gate stack in the periphery. All these layers are deposited in both regions of interest (in the memory example, in both periphery and memory array regions). Polysilicon can be variably doped to establish a desired transistor work function, such that a single material deposition, and different doping steps, can be used to define gates for both NMOS and PMOS of a CMOS circuit. The overlying metallic layer 66 can serve to improve lateral signal propagation speeds along lines controlling the gates, and comprises tungsten (W) in the illustrated embodiment. The intervening metallic layer 64 can ensure physical and electrical compatibility (e.g., fulfilling adhesion and barrier functions) at the juncture between the polysilicon layer 60 and the overlying metallic layer 66, and in the illustrated embodiment comprises titanium nitride, and more particularly metal-rich metal nitride.

Figure 17:
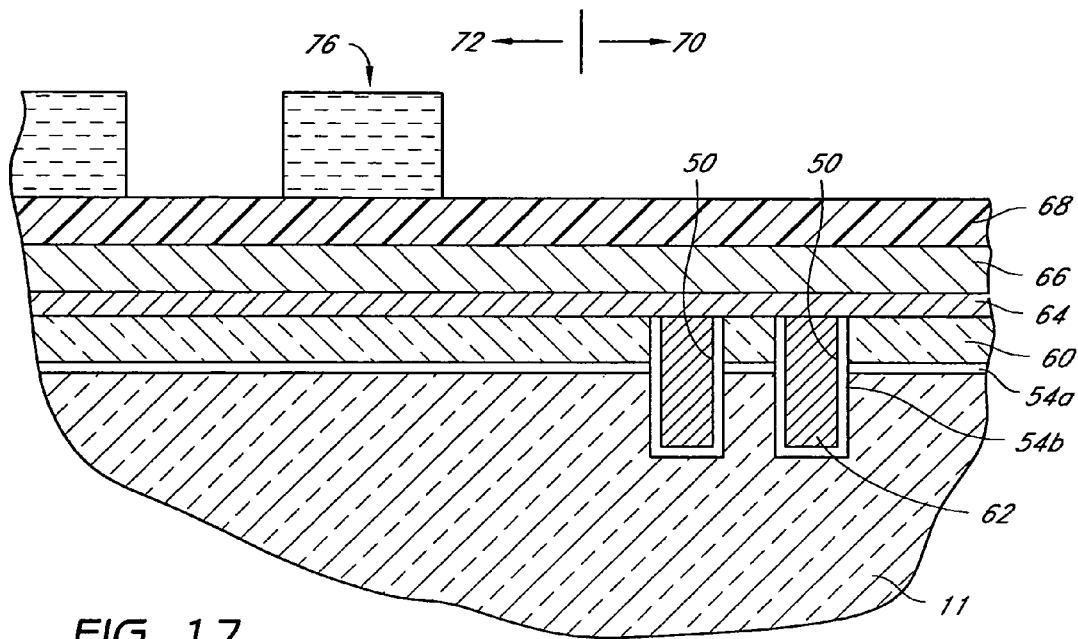

Referring to FIG. 17, the gate stack also includes a cap layer 68, formed of silicon nitride in the illustrated embodiment. FIG. 17 shows the trenches 50, filled with the metallic material 62, in a first or memory array region 70 of the substrate. The gate stacks layers 54a, 60, 64, 66 and 68 extend across both the array region 70 and the second or periphery or logic region 72 of the substrate. A photoresist mask 76 is configured for patterning transistor gates in the periphery 72.

Figure 18:
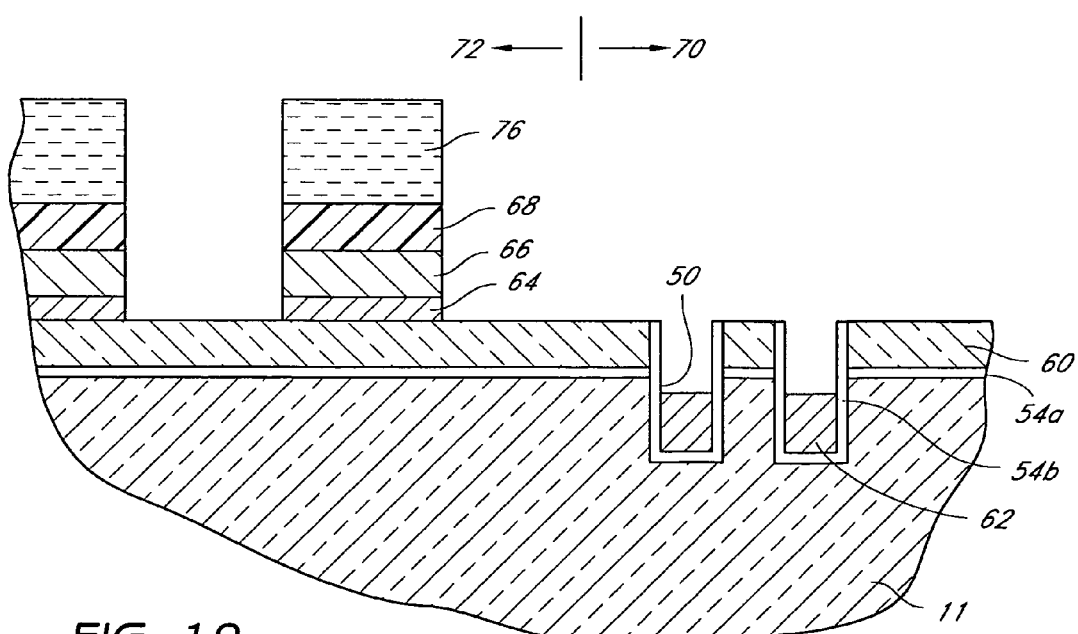

As shown in FIG. 18, a series of etch steps etches first through the cap layer 68, including a metal etch to remove the metallic layer(s) 64, 66. Chlorine-based reactive ion etch (RIE), for example, can selectively remove typical metallic materials, such as the illustrated tungsten strapping layer 66 and intervening metal nitride layer 64, while stopping on the underlying polysilicon layer 60. A high degree of selectivity enables continuing the metal etch after exposure of the polysilicon 60 until the metallic material 62 is recessed in the trenches 50, as shown.

Figure 19:
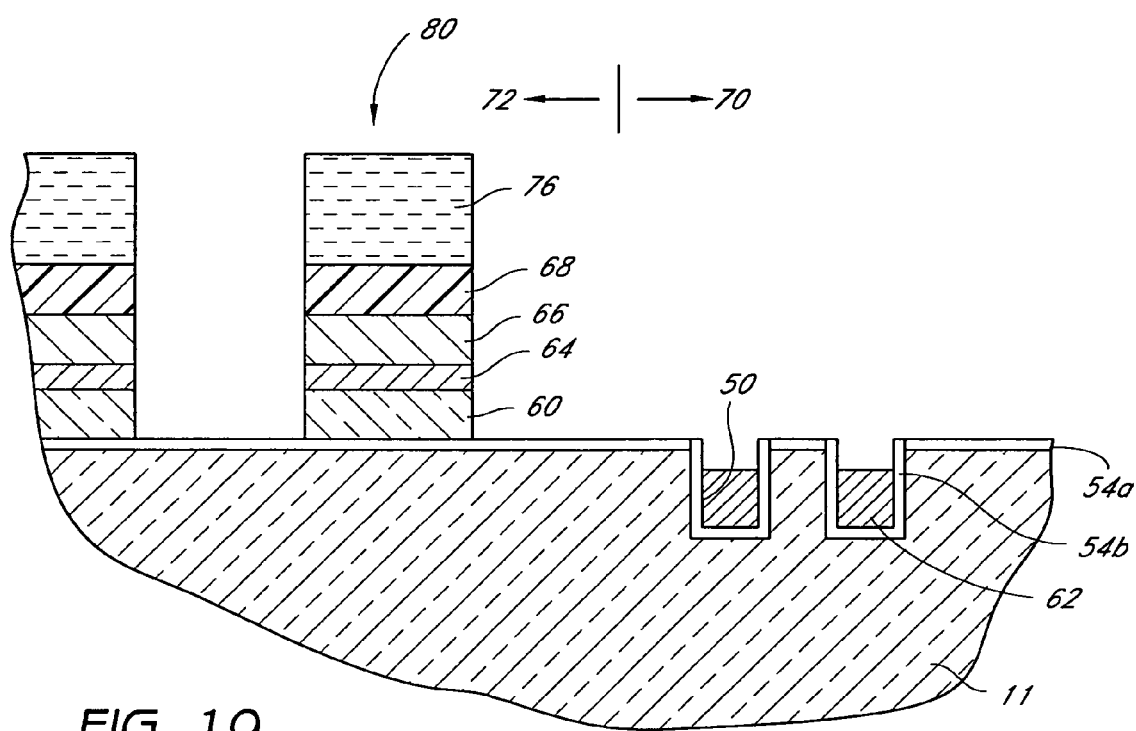

Referring now to FIG. 19, the etch chemistry can be switched following recessing of the metallic gate material 62 in the array trenches, and the silicon 60 can be patterned using the same mask 76, completing patterning of the gate stacks 80 for the periphery 72.

Figure 20:
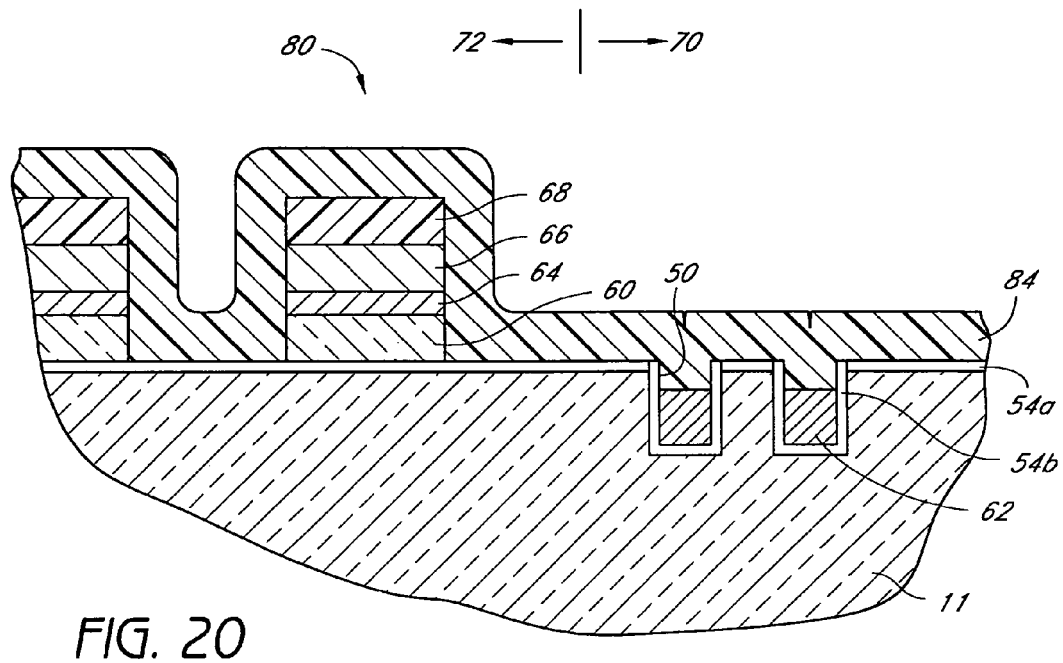

Referring now to FIG. 20, following removals of the mask, a spacer layer 84 is deposited over the substrate, coating the gate stacks 80 conformally but filling the recesses at the top of the array trenches 50. In the illustrated embodiment, the spacer layer 84 comprises silicon nitride, but the skilled artisan will appreciate that a number of different insulating materials can be used.

Figure 21:
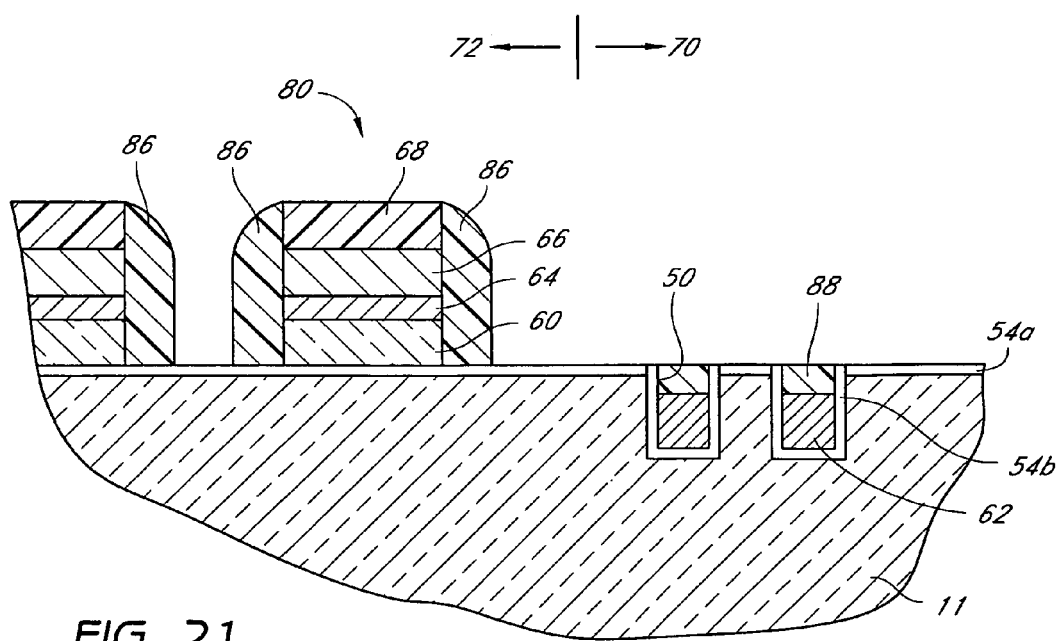

As shown in FIG. 21, a subsequent spacer etch (directional etch) leaves sidewall spacers 86 along sidewalls of the gate stacks 80, allowing self-aligned doping of source/drain areas. In the array 72, however, because the shallow recesses at the top of the trenches are filled with the spacer layer 84 (see FIG. 20), the spacer etch merely etches the spacer material back in the array 72, leaving an insulating cap layer 88 burying the gate material 62 within the trenches 50.

The skilled artisan will appreciate that various doping steps for CMOS transistors, including source/drain, channel enhancement, gate electrode, lightly doped drain (LDD) and halo doping, are omitted in the description herein for simplicity.

The embodiment of FIGS. 13-21 thus facilitates simultaneous processing of transistors in the array and the periphery. In the illustrated embodiment, the array transistors are recessed access devices (RADs), whereas the peripheral gates are formed above the substrate 11 as conventional planar MOS transistors. While described in the context of conventional CMOS circuitry in the periphery, the skilled artisan will appreciate that the peripheral transistors can take other forms. Advantageously, in the illustrated embodiment, the metallic layer in the RAD trenches can be recessed at the same time as patterning the peripheral gate stacks. Furthermore, the peripheral sidewall spacers are simultaneously formed with the insulating cap on the RAD gates or word lines.

Although not shown, it will be understood that conventional DRAM fabrication techniques may be used to create the other circuit elements shown in FIG. 2. For example, different levels of doping may be used to form the drains 18 and source 20 of FIG. 2, and the stacked storage capacitors 24 may be formed according to a plurality of deposition and masking steps.

As a result of the device layout and its method of manufacture, the completed memory device 10 shown in FIGS. 1 and 2 possesses a number of advantages in comparison to conventional DRAM. For example, the size of each memory cell and the overall size of the memory device 10 may be substantially reduced without a corresponding, substantial reduction in the distance between adjacent sense amplifiers. Moreover, the word lines 12 and digit lines 14 may have substantially different pitches, which enables the digit lines 14 to have far greater separation than the word lines 12. For example, in the preferred embodiment, the word lines 12 have an effective pitch of 1.5F, while the digit lines 14 may have a pitch of 3F. In addition, the steps for forming the digit lines 14 and word lines 12 are simplified by making them substantially linear and generally perpendicular to one another, while realizing space-savings by placing the active areas 16 at an angle to these elements. The word lines 12 in the preferred embodiment are also recessed, and, unlike the layout in conventional DRAM, there is no spacer using up valuable space between the gates and the sources or drains of the active areas (as may be easily seen in FIG. 2). Thus, the memory device 10 may be made more dense.

Furthermore, the use of a mixture of metals facilitates full silicidation of the silicon buried within trenches 50 without the harmful formation of voids. Accordingly, a high conductivity can be achieved for the relatively small volume word lines.

While certain embodiments of the inventions have been described, these embodiments have been presented by way of example only, and are not intended to limit the scope of the invention. Indeed, the novel methods and devices described herein may be embodied in a variety of other forms; furthermore, various omissions, substitutions and changes in the form of the methods and devices described herein may be made without departing from the spirit of the invention. The accompanying claims and their equivalents are intended to cover such forms or modifications as would fall within the scope and spirit of the invention.

We claim:

1. A method of manufacturing a memory device, the method comprising:
   providing a substrate;
   defining at least one active area within the substrate, said active area comprising a source and two drains, the source and at least one of the drains forming a line along which a first axis is defined;
   defining at least one pair of word lines within the substrate by a pitch-doubling technique, the word lines of the pair being parallel one another over the active area along a word line axis; and
   defining at least two digit lines above the substrate, at least a portion of one of the at least two digit lines extending above the source and defining a second axis that forms an acute angle with the first axis, the second axis running perpendicular to the word line axis, the at least two digit lines having a pitch of between 2.75 and 3.25 times a minimum resolution (F) of a photolithographic technique used to form the memory device.

2. The method of claim 1, wherein defining the word lines further comprises recessing the word lines into the substrate.

3. The method of claim 1, wherein defining the word lines further comprises:
   forming a pattern of lines in a photoresist layer by photolithography;
   etching the pattern of lines through the photoresist layer onto a hard mask layer;
   stripping the photoresist layer;
   depositing spacer material over the hard mask layer;
   etching the spacer material to remove the spacer material from horizontal surfaces of the hard mask layer and form spacers on sidewalls of the hard mask layer;
   depositing a material between the spacers and which is different composition from the spacers;
   stripping the spacer material to form at least one pair of trenches;
   etching into the substrate to deepen the at least one pair of trenches; and
   partially filling the at least one pair of trenches with an electrode material.

4. The method of claim 3, wherein the step of depositing an electrode material further comprises:
   depositing polysilicon to fill the at least one pair of trenches;
   etching back the polysilicon within the at least one pair of trenches;
   depositing a metal layer to substantially cover the etched back polysilicon; and
   siliciding the polysilicon by an annealing step.

5. The method of claim 3, wherein partially filling comprises filling the at least one pair of trenches with a metallic material and recessing the metallic material in the trenches.

6. The method of claim 1, wherein defining the word lines comprises simultaneously defining logic gates in another region of the memory device.

7. A method of forming a memory device, the method comprising:
   providing a substrate;
   defining at least one active area within the substrate, said active area comprising a source and two drains, the source and at least one of the drains forming a line along which a first axis is defined;
   defining at least one pair of word lines within the substrate, the pair of word lines intersecting the at least one active area and the pair of word lines having a pitch of less than two times a minimum resolution (F) of a photolithographic technique used to form the memory device, the word lines of the pair being parallel one another over the active area along a word line axis; and
   defining at least two digit lines above the substrate along a second axis generally perpendicular to the at least one pair of word lines, at least a portion of one of the at least two digit lines extending above the source and defining a bit line axis above the source, the bit line axis running perpendicular to the word line axis, the at least two digit lines having a pitch of between 2.75 and 3.25 times the minimum resolution.

8. The method of claim 7, wherein an acute angle between the first and second axes is within the range of 10 to 80 degrees.

9. The method of claim 8, wherein the acute angle between the first and second axes is within the range of 40 to 50 degrees.

10. The method of claim 9, wherein the acute angle between the first and second axes is about 45 degrees.

11. The method of claim 7, wherein the word lines are defined by a width that is less than the minimum resolution.

12. The method of claim 7, wherein the word lines are fully recessed.

13. The method of claim 7, wherein the step of defining the at least one pair of word lines further comprises:
   defining the at least one pair of word lines according to a pitch-doubling technique.

14. A method of manufacturing a memory device, comprising:
   providing a substrate;
   defining at least two rows of active areas within the substrate, said active areas individually comprising a source and two drains, the source and drains of individual active areas forming a line along which a first axis is defined, the first axes within each row being parallel one another, the first axes within adjacent of the two rows being parallel one another;
   defining at least two pairs of word lines within the substrate, the word lines within each pair being parallel one another along a word line axis, one of the two pairs of word lines extending along one of the two rows of active areas, another of the two pairs of word lines extending along an adjacent of the two rows of active areas; and
   defining at least two digit lines above the substrate, at least a portion of one of the at least two digit lines extending above the source and defining a second axis that forms an acute angle with the first axis, the at least two digit lines having a pitch of between 2.75 and 3.25 times a minimum resolution (F) of a photolithographic technique used to form the memory device.

* * * * *